United States Patent
Qin et al.

(10) Patent No.: US 10,566,048 B2
(45) Date of Patent: Feb. 18, 2020

(54) MANAGING REFRESH OPERATIONS FOR A MEMORY DEVICE

(71) Applicant: Western Digital Technologies, Inc., San Jose, CA (US)

(72) Inventors: Minghai Qin, San Jose, CA (US); Won Ho Choi, San Jose, CA (US); Zvonimir Bandic, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 234 days.

(21) Appl. No.: 15/811,661

(22) Filed: Nov. 13, 2017

(65) Prior Publication Data
US 2019/0147941 A1 May 16, 2019

(51) Int. Cl.
*G11C 16/04* (2006.01)
*G11C 11/419* (2006.01)
*G11C 16/34* (2006.01)

(52) U.S. Cl.
CPC .......... *G11C 11/419* (2013.01); *G11C 16/349* (2013.01); *G11C 16/3422* (2013.01); *G11C 16/0483* (2013.01)

(58) Field of Classification Search
CPC .................................................. G11C 11/419
USPC .................................................. 365/185.02
See application file for complete search history.

(56) References Cited

U.S. PATENT DOCUMENTS

| | | | |
|---|---|---|---|
| 9,711,234 B1 * | 7/2017 | Van Gaasbeck ... | G11C 16/3431 |
| 2013/0215682 A1 * | 8/2013 | Yang ...................... | G11C 16/06 |
| | | | 365/185.29 |
| 2017/0269992 A1 * | 9/2017 | Bandic .................. | G06F 11/108 |

* cited by examiner

*Primary Examiner* — Vu A Le
(74) *Attorney, Agent, or Firm* — Kunzler Bean & Adamson, PC

(57) ABSTRACT

Apparatus, systems, methods, and computer program products for managing refresh operations in memory devices are disclosed. An apparatus includes a memory device including a plurality of memory cells comprising an associated set of counters and a controller for the memory device. A controller is configured to randomly increment a counter associated with a memory cell in response to write disturbances for the memory cell. A controller is configured, in response to a counter being randomly incremented to a predetermined count, perform a refresh operation on a memory cell.

20 Claims, 13 Drawing Sheets

MANAGING REFRESH OPERATIONS FOR A MEMORY DEVICE

TECHNICAL FIELD

The present disclosure, in various embodiments, relates to memory devices and more particularly relates to managing refresh operations for a memory device.

BACKGROUND

In some write-in-place memory devices (e.g., resistive random access memory (ReRAM) devices), a write disturbance is a situation in which the SET or RESET states of a memory cell are weakened due to programming or performing write operations on an adjacent of neighbored memory cell. Write disturbances may cause serious problem for reliably sensing data stored in a memory cell since repeated write disturbances may degrade the state of a memory cell.

SUMMARY

Apparatuses are presented for managing refresh operations for a memory device. In one embodiment, a memory device includes a plurality of memory cells comprising an associated set of counters. A controller for a memory device, in certain embodiments, is configured to randomly increment a counter associated with a memory cell in response to a write disturbance for the memory cell. In some embodiments, a controller is configured to, in response to a counter being randomly incremented to a predetermined count, perform a refresh operation on a memory cell.

Other apparatuses for managing refresh operations for a memory device are presented. In one embodiment, an apparatus includes means for randomly incrementing a counter associated with a set of memory cells of a plurality of sets of memory cells of a write-in-place memory device in response to a write disturbance for an associated set of memory cells. An apparatus, in certain embodiments, includes means for performing a refresh operation on each memory cell in a set of memory cells in response to a counter being randomly incremented to a predetermined count.

Systems are presented for managing refresh operations for a memory device. In one embodiment, a storage class memory device includes a plurality of sets of memory cells and each set of memory cells is associated with a counter. A controller for a storage class memory device, in certain embodiments, is configured to increment a counter associated with a set of memory cells in response to a write disturbance for any memory cell in the set of memory cells. A controller, in one embodiment, in response to a counter being incremented to a predetermined count, is configured to perform a refresh operation on each memory cell in a set of memory cells.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1A:
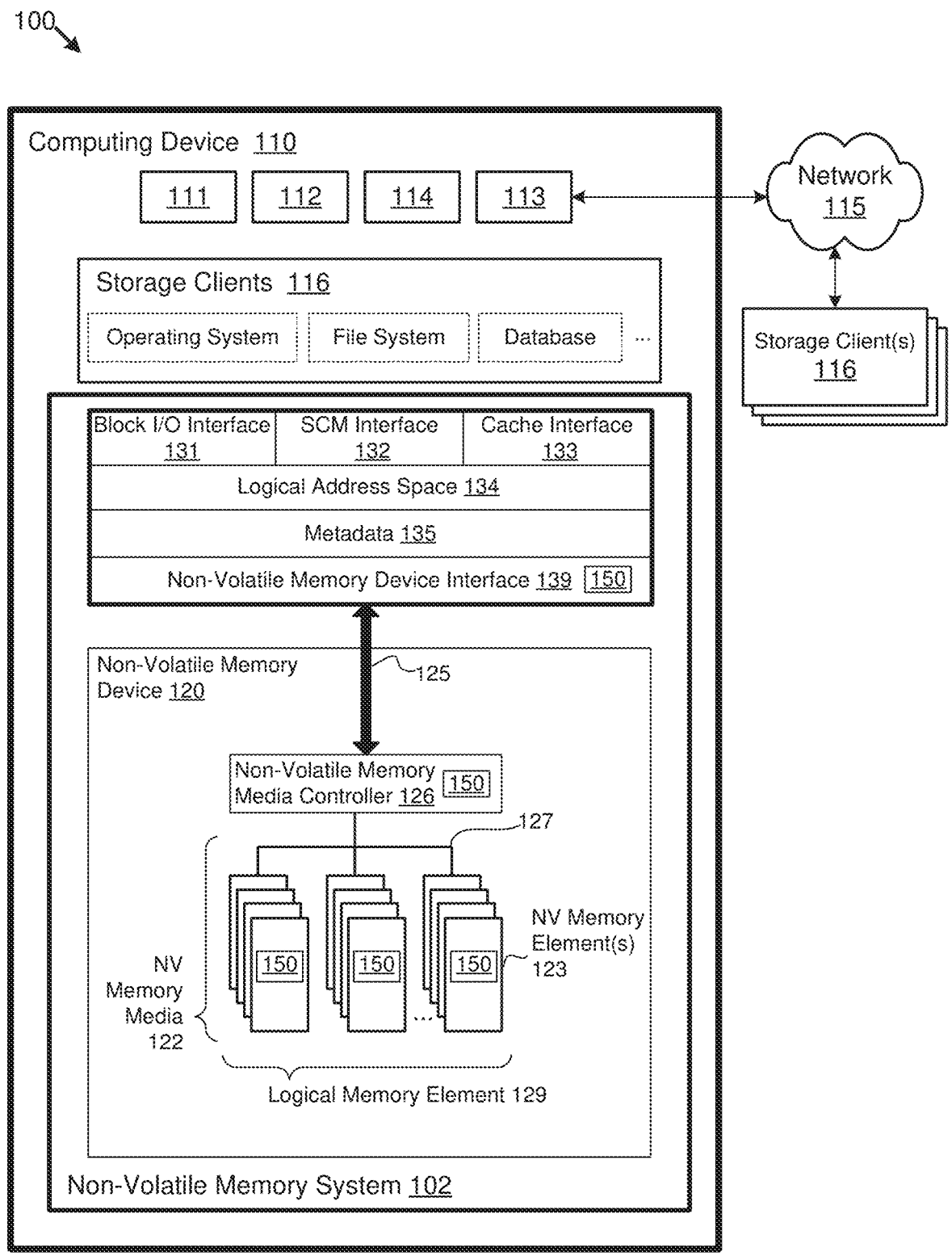
FIG. 1A is a schematic block diagram illustrating one embodiment of a system including dynamically assignable computing data latches.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer-readable storage media storing computer-readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer-readable and/or executable storage media. Any combination of one or more computer-readable storage media may be utilized. A computer-readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer-readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

In addition, as used herein, the term "set" may mean "one or more," unless expressly specified otherwise. The term "sets" may mean multiples of or a plurality of "one or mores," "ones or more," and/or "ones or mores" consistent with set theory, unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, may be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A is a block diagram of one embodiment of a system 100 comprising a refresh component 150 for a controller 126 of a non-volatile memory device 120. The refresh component 150 may be part of and/or in communication with the controller 126, a non-volatile memory element 123, a device driver, or the like. The refresh component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer-readable storage medium 114. The computer-readable storage medium 114 may comprise executable instructions configured to cause the computing device 110 (e.g., processor 111) to perform steps of one or more of the methods disclosed herein. Alternatively, or in addition, the refresh component 150 may be embodied as one or more computer-readable instructions stored on the non-transitory storage medium 114.

The non-volatile memory system 102, in the depicted embodiment, includes a refresh component 150. In certain embodiments, as an example, a maximum quantity of write disturbance in some write-in-place memory cells may be about $10^5$ write disturbances, or the like. Here, in this example, if the quantity of write operations to a neighboring memory cell of a "victim" memory cell is greater than about $10^5$ write operations, the victim memory cell's state may be changed since the victim memory cell will experience $10^5$ write disturbances. To prevent a change in state in victim memory cell(s), a refresh operation may be performed on the victim memory cell(s).

Issues may occur in tracking the quantity of write disturbances experienced by a victim memory cell. One issue in tracking the quantity of write disturbances experienced by a victim memory cell includes counters that may track the write disturbances consuming a large quantity of memory space. Specifically, if a memory cell uses a counter to track up to $10^5$ write disturbances for the memory cell, the counter would need at least 17 bits (e.g., $2^{17}$ counts) to track the $10^5$ write disturbances, which may consume a significant amount of memory capacity.

For instance, a 17-bit counter for each memory block of a memory device with 16-byte memory blocks would consume about 13.28% of the storage space of a memory device (17 bits/16 bytes=0.1328). As such, a counter to track $10^5$ write disturbances in each memory block of a 1 TB memory device may consume over 130 GB of storage space.

In order to reduce an overhead of tracking disturb events, or the like, the refresh component 150, in various embodiments, may manage refresh operations in a memory device by randomly incrementing a counter associated with a memory cell in response to one or more write disturbances for the memory cell and, in response to the counter being randomly incremented to a predetermined count, perform a refresh operation on the memory cell. In additional or alternative embodiments, the refresh component 150 may manage refresh operations in a memory device by incrementing a counter associated with a set or group of memory cells in response to a write disturbance for any memory cell in the set/group of memory cells and, in response to the counter being incremented to a predetermined count, perform a refresh operation on each memory cell in the set/group of memory cells.

In one embodiment, the refresh component 150 may comprise logic hardware of one or more non-volatile memory devices 120, such as a controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the refresh component 150 may comprise executable software code, such as a device driver or the like, stored on the computer-readable storage medium 114 for execution on the processor 111. In a further embodiment, the refresh component 150 may include a combination of both executable software code and logic hardware.

In one embodiment, the refresh component 150 is configured to receive I/O requests from a device driver or other executable application via a bus 125 or the like. The refresh component 150 may be further configured to transfer data to/from a device driver and/or storage clients 116 via the bus 125. Accordingly, the refresh component 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the refresh component 150 may receive storage requests as an API call from a storage client 116, as an IO-CTL command, or the like. Of note, a refresh component 150 included in the various embodiments discussed with reference to FIG. 1A may be similar to the various embodiments of a refresh component 150 discussed elsewhere herein.

According to various embodiments, a controller 126 (e.g., a device controller) in communication with one or more refresh components 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more controllers 126.

A device driver may present a logical address space 134 to the storage clients 116 through one or more interfaces. As discussed above, the logical address space 134 may comprise a plurality of logical addresses, each corresponding to respective media locations of the one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, or the like. A controller 126 may be configured to manage data operations on the non-volatile memory media 122, and may comprise one or more processors, programmable processors (e.g., FPGAs), ASICs, micro-controllers, or the like. In some embodiments, the controller 126 is configured to store data on and/or read data from the non-volatile memory media 122, to transfer data to/from the non-volatile memory device 120, and so on.

The controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The controller 126 may organize a block of word lines within a non-volatile memory element 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory element 123 may be physically arranged in a monotonically increasing sequence of word line addresses, with consecutively addressed word lines also being physically adjacent (e.g., WL0, WL1, WL2, . . . WLN).

The controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library.

A device driver may be further configured to provide a cache interface 133 for caching data using the non-volatile memory system 102. A device driver may further comprise a non-volatile memory device interface 139 that is configured to transfer data, commands, and/or queries to the controller 126 over a bus 125, as described above.

Figure 1B:
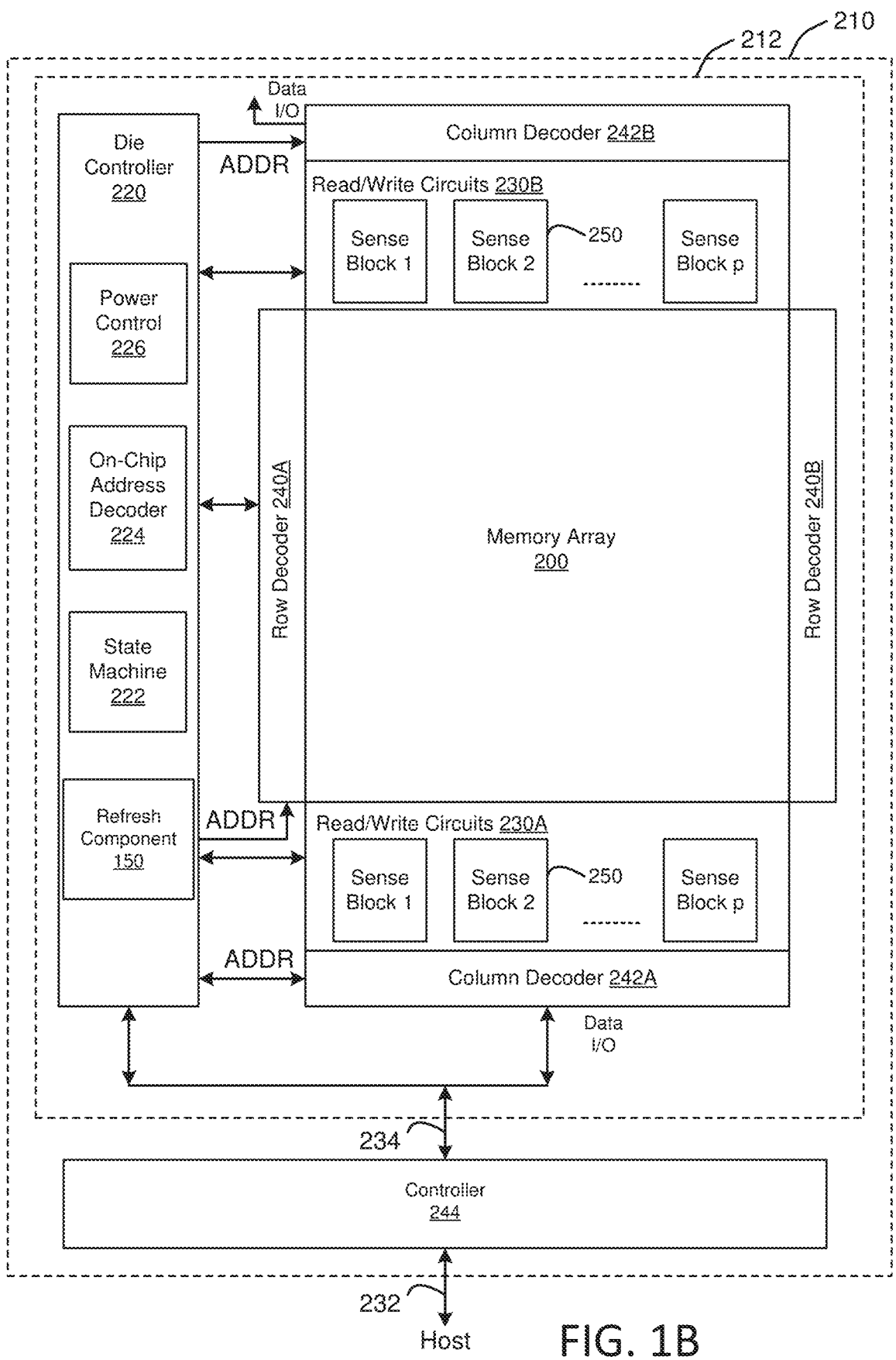
FIG. 1B is a schematic block diagram illustrating another embodiment of a system including dynamically assignable computing data latches.

FIG. 1B illustrates an embodiment of a non-volatile storage device 210 that may include one or more memory die or chips 212. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation may include multiple chips 212.

Die controller 220, in one embodiment, cooperates with the read/write circuits 230A/230B to perform memory operations on the memory array 200. The die controller 220, in certain embodiments, includes a refresh component 150, a state machine 222, and an on-chip address decoder 224. In one embodiment, the state machine 222 comprises at least a portion of the refresh component 150. In a further embodiment, the controller 244 comprises at least a portion of the refresh component 150. In various embodiments, one or more of the sense blocks 250 comprises at least a portion of the refresh component 150.

The state machine 222, in one embodiment, provides chip-level control of memory operations. The on-chip address decoder 224 provides an address interface to convert between the address that is used by the host or a memory controller to the hardware address used by the decoders 240A, 240B, 242A, and 242B. In certain embodiments, the state machine 222 includes an embodiment of the refresh component 150. The refresh component 150, in certain embodiments, is embodied as software in a device driver, hardware in a controller 244, and/or hardware in a die controller 220 and/or state machine 222.

In one embodiment, one or any combination of die controller 220, refresh component 150, decoder circuit 224, state machine circuit 222, decoder circuit 242A, decoder circuit 242B, decoder circuit 240A, decoder circuit 240B, read/write circuits 230A, read/write circuits 230B, and/or controller 244 may be referred to as one or more managing circuits. A refresh component 150 included in the various embodiments discussed with reference to FIG. 1B may be similar to the various embodiments of a refresh component 150 discussed elsewhere herein.

Figure 2:
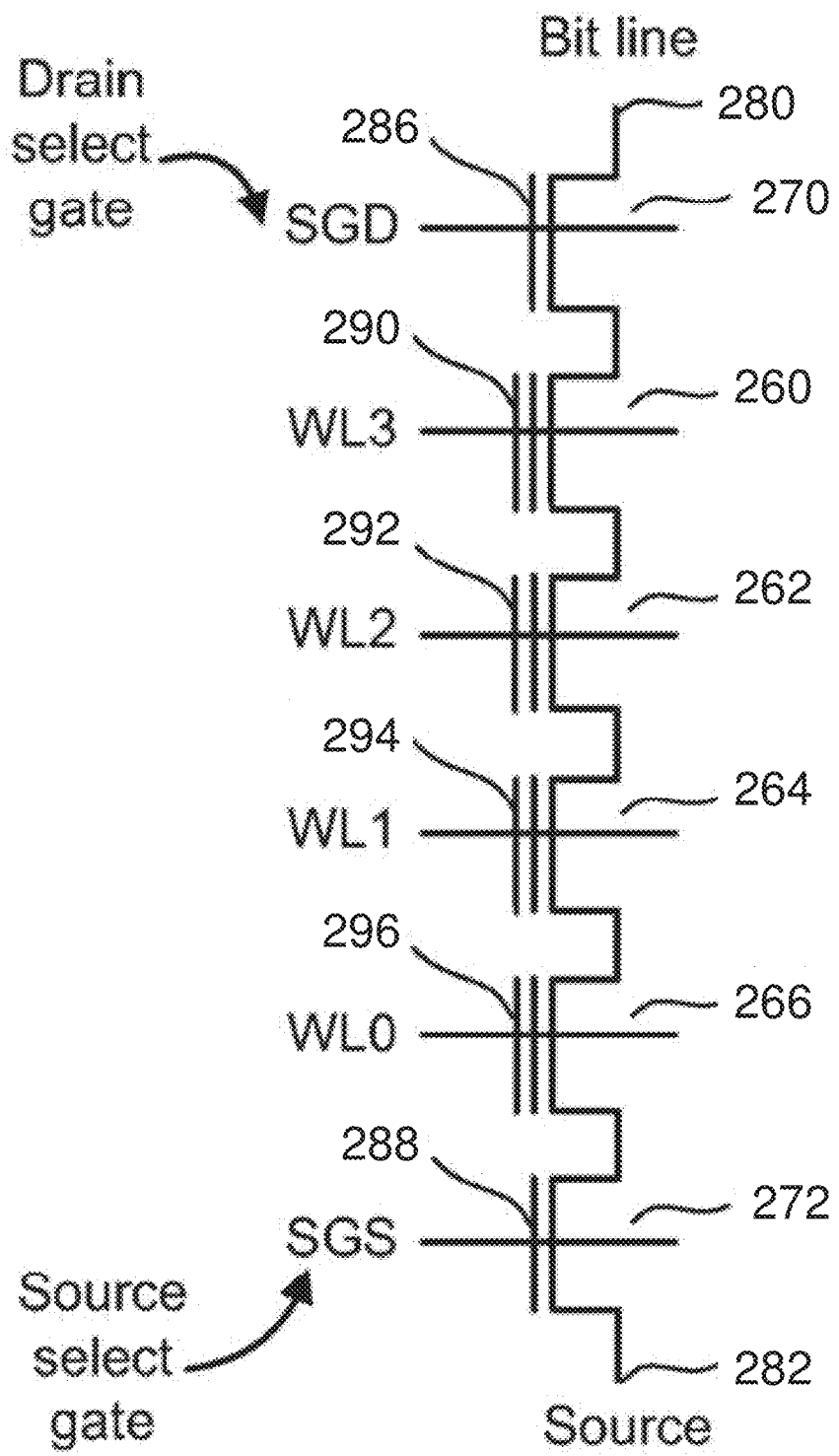
FIG. 2 is a schematic block diagram illustrating one embodiment of a string of storage cells.

FIG. 2 depicts one embodiment of a memory string comprising a plurality of storage elements. The memory string depicted in FIG. 2, in some embodiments, includes four transistors 260, 262, 264, and 266 connected in series and located between a first select transistor 270 and a second select transistor 272. In some embodiments, a transistor 260, 262, 264, and 266 includes a control gate and a floating gate. A control gate 290, 292, 294, and 296, in one embodiment, is connected to, or comprises a portion of, a word line. In a further embodiment, a transistor 260, 262, 264, and 266 is a storage element, storage cell, or the like, also referred to as a memory cell such that the terms memory cell and storage cell are interchangeable. In some embodiments, a storage element may include multiple transistors 260, 262, 264, and 266.

The first select transistor 270, in some embodiments, gates/connects the memory string connection to a bit line 280 via a drain select gate SGD. The second select transistor 272, in certain embodiments, gates/connects the memory string connection to a source line 282 via a source select gate SGS. The first select transistor 270, in a further embodiment, is controlled by applying a voltage to a corresponding select gate 286. The second select transistor 272, in some embodiments, is controlled by applying a voltage to corresponding select gate 288.

As shown in FIG. 2, the source line 282, in one embodiment, is connected to the sources of each transistor/storage cell 260, 262, 264, and 266 in the memory string. The memory string, in some embodiments, may include some storage elements 260, 262, 264, and 266 that have been programmed and some storage elements 260, 262, 264, and 266 that have not been programmed. As described in more detail below, the refresh component 150 controls whether portions of a storage device, such as a memory string, uses are used for operations.

Figure 3:
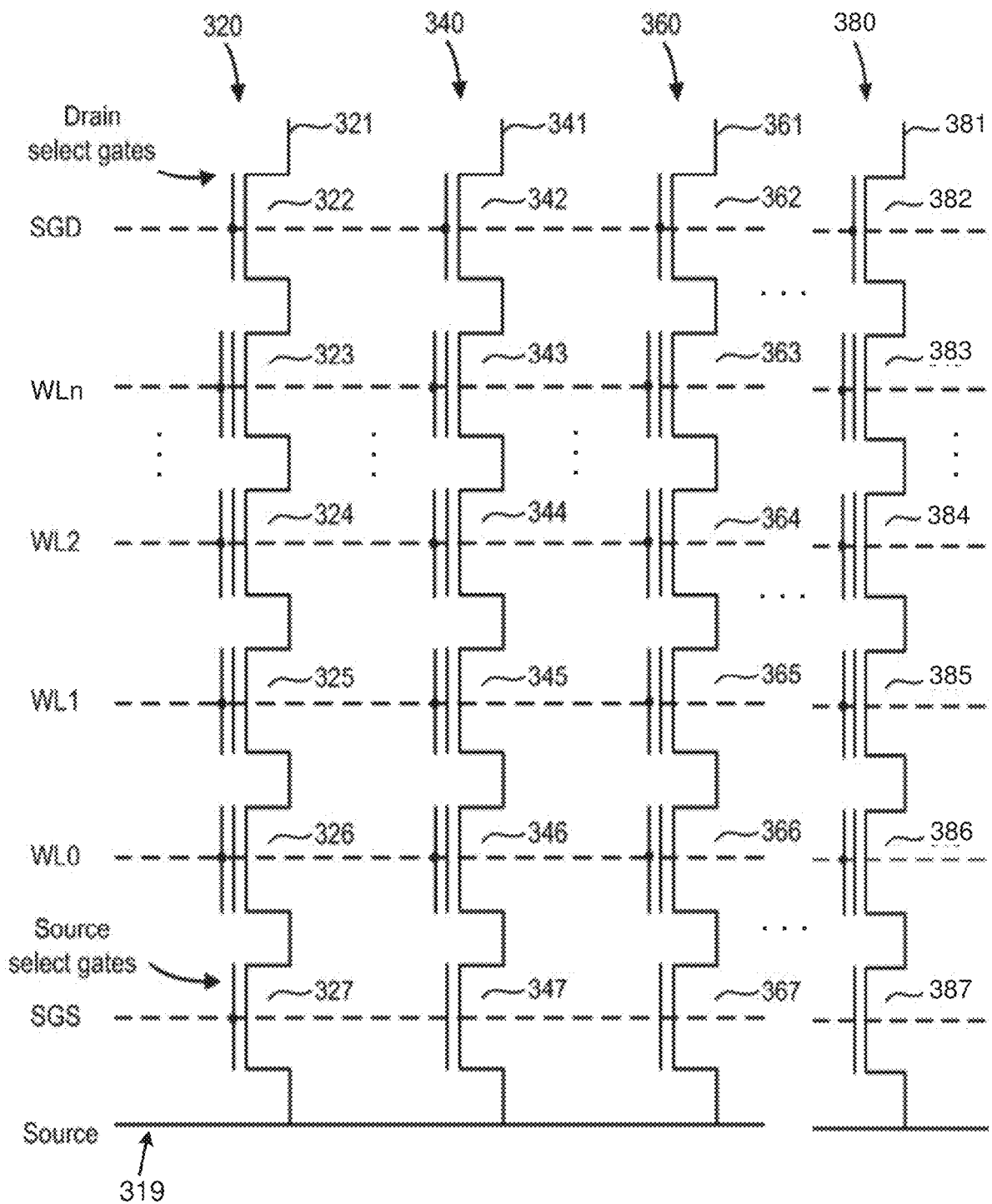
FIG. 3 is a schematic block diagram illustrating one embodiment of an array of storage cells.

FIG. 3 is a circuit diagram depicting a plurality of memory strings 320, 340, 360, and 380. The architecture for a memory system using a memory structure may include several memory strings 320, 340, 360, and 380. For example, FIG. 3 illustrates memory strings 320, 340, 360, and 380 in a memory array 200 that includes multiple memory strings 320, 340, 360, and 380. In the depicted embodiment, each memory string 320, 340, 360, and 380 includes drain select transistors 322, 342, 362, and 382, source select transistors 327, 347, 367, and 387, and storage elements 323-326, 343-346, 363-366, and 383-386. While four storage elements 323-326, 343-346, 363-366, and 383-386 per memory string 320, 340, 360, and 380 are illustrated for simplicity, some memory strings 320, 340, 360, and 380 may include any number of storage elements, e.g., thirty-two, sixty-four, or the like storage elements.

Memory strings 320, 340, 360, and 380, in one embodiment, are connected to a source line 319 by source select transistors 327, 347, 367, 387. A selection line SGS may be used to control the source side select transistors. The various memory strings 320, 340, 360, and 380, in one embodiment, are connected to bit lines 321, 341, 361, 381 by drain select transistors 322, 342, 362, and 382. The drain select transistors 322, 342, 362, and 382 may be controlled by a drain select line SGD. In some embodiments, the select lines do not necessarily need to be in common among the memory strings 320, 340, 360, and 380; that is, different select lines may be provided for different memory strings 320, 340, 360, and 380.

As described above, each word line WL0-WLn comprises one or more storage elements 323-383, 324-384, 325-385, and 326-386. In the depicted embodiment, each bit line 321, 341, 361, 381 and the respective memory string 320, 340, 360, and 380 comprise the columns of the memory array 200, storage block, erase block, or the like. The word lines WL0-WLn, in some embodiments, comprise the rows of the memory array 200, storage block, erase block, or the like. Each word line WL0-WLn, in some embodiments, connects the control gates of each storage element 323-383, 324-384, 325-385, and 326-386 in a row. Alternatively, the control gates may be provided by the word lines WL0-WLn themselves. In some embodiments, a word line WL0-WLn may include tens, hundreds, thousands, millions, or the like of storage elements 323-383, 324-384, 325-385, and 326-386.

In one embodiment, each storage element 323-326, 343-346, 363-366, and 383-386 is configured to store data. For example, when storing one bit of digital data, the range of possible threshold voltages ("VTH") of each storage element 323-326, 343-346, 363-366, and 383-386 may be divided into two ranges which are assigned logical data "1" and "0." In one example of a NAND type flash memory, the VTH may be negative after the storage elements 323-326, 343-346, 363-366, and 383-386 are erased, and defined as logic "1." In one embodiment, the VTH after a program operation is positive and defined as logic "0." Other types of memory may store data using a range of possible threshold resistances, currents, or the like.

When the VTH is negative and a read is attempted, in some embodiments, storage elements 323-326, 343-346, 363-366, and 383-386 will turn on to indicate logic "1" is being stored. When the VTH is positive and a read operation is attempted, in a further embodiment, a storage element will not turn on, which indicates that logic "0" is stored. Each storage element 323-383, 324-384, 325-385, and 326-386 may also store multiple levels of information, for example, multiple bits of digital data. In such an embodiment, the range of VTH value is divided into the number of levels of data. For example, if four levels of information may be stored in each storage element 323-326, 343-346, 363-366, and 383-386, there will be four VTH ranges assigned to the data values "11", "10", "01", and "00."

In one example of a NAND type memory, the VTH after an erase operation may be negative and defined as "11." Positive VTH values may be used for the states of "10", "01", and "00." In one embodiment, the specific relationship between the data programmed into the storage elements 323-326, 343-346, 363-366, and 383-386 and the threshold voltage ranges of the storage elements 323-326, 343-346, 363-366, and 383-386 depends upon the data encoding scheme adopted for the storage elements 323-326, 343-346, 363-366, and 383-386.

In some embodiments, portions of the storage elements 323-326, 343-346, 363-366, and 383-386 may be defective.

In such an embodiment, the refresh component 150 may manage which portions of the storage elements 323-326, 343-346, 363-366, and 383-386 are used for operations.

Figure 4:
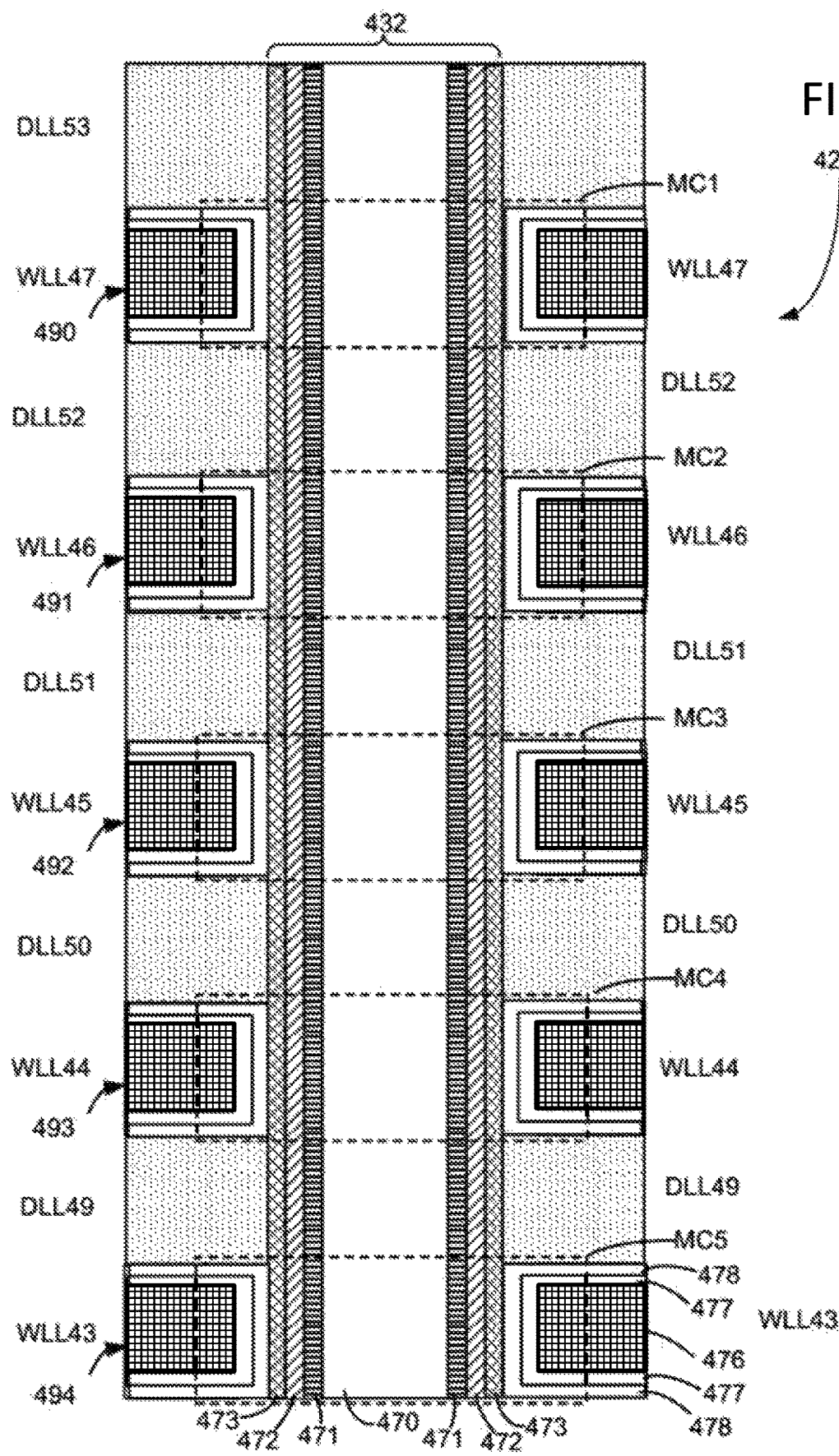
FIG. 4 is a schematic block diagram illustrating one embodiment of a three-dimensional (3-D), vertical memory structure.

FIG. 4 illustrates one embodiment of a cross-sectional view of a 3D, vertical memory structure 429 or string 429. In one embodiment, the vertical column 432 is round and includes four layers; however, in other embodiments more or less than four layers may be included and other shapes may be used (e.g., a "U" shape instead of an "I" shape or the like). In one embodiment, a vertical column 432 includes an inner core layer 470 that is made of a dielectric, such as SiO2. Other materials may also be used. Surrounding inner core 470 is polysilicon channel 471. Materials other than polysilicon may also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is a shared charge-trapping layer 473, such as (for example) Silicon Nitride. Other materials and structures may also be used. The technology described herein is not limited to any particular material or structure.

FIG. 4 depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide (SiO2) layer 478. The physical interaction of the word line layers with the vertical column forms the memory cells. Thus, a memory cell, in one embodiment, comprises channel 471, tunneling dielectric 472, charge-trapping layer 473 (e.g., shared with other memory cells), blocking oxide layer 478, aluminum oxide layer 477 and word line region 476. In some embodiments, the blocking oxide layer 478 and aluminum oxide layer 477, may be replaced by a single layer of material with insulating properties or by more than 2 layers of different material with insulating properties. Furthermore, the materials used are not limited to silicon dioxide (SiO2) or aluminum oxide. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge-trapping layer 473 that is associated with the memory cell. These electrons are drawn into the charge-trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge-trapping layer. During an erase operation, the electrons return to the channel or holes are injected into the charge-trapping layer to recombine with electrons. In one embodiment, erasing is achieved using hole injection into the charge-trapping layer via a physical mechanism such as gate induced drain leakage (GIDL).

Storage cells in the same location or position in different memory structures 429 (e.g., different memory strings 429) on different bit lines, in certain embodiments, may be on the same word line. Each word line may store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D memory structure 429 comprises an "I" shaped memory structure 429. In other embodiments, a vertical, 3D memory structure 429 may comprise a "U" shaped structure, or may have another vertical and/or stacked architecture. In certain embodiments, four sets of strings 429 (e.g., four sets of 48 word lines, or another predefined number of word lines) may form an erase block, while in other embodiments, fewer or more than four sets of strings 429 may form an erase block. As may be appreciated, any suitable number of storage cells may be part of a single string 429. In one embodiment, a single string 429 includes 48 storage cells.

Figure 5:
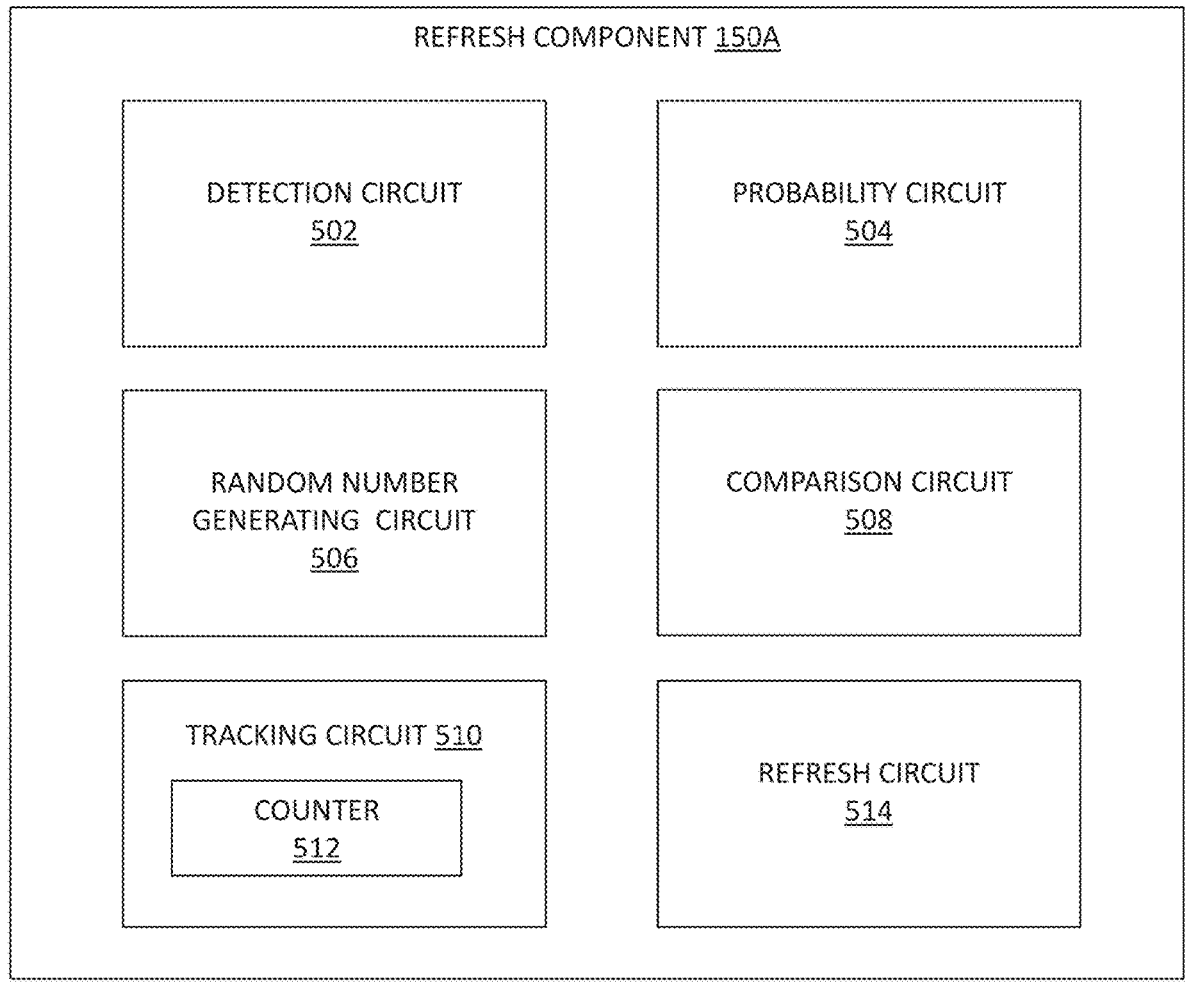
FIG. 5 is a schematic block diagram illustrating one embodiment of a refresh component included in the system of FIG. 1A and/or FIG. 1B.

FIG. 5 is a block diagram of one embodiment of a refresh component 150A. At least in the illustrated embodiment, the refresh component 150A includes, among other components, a detection circuit 502, a probability circuit 504, a random number generation circuit 506, a comparison circuit 508, a tracking circuit 510 including a set of counters 512, and a refresh circuit 514.

A detection circuit 502 may include any suitable hardware and/or software that may detect and/or determine write operations and/or write disturbances. In some embodiments, a detection circuit 502 may detect/determine write operations being performed on a memory device (e.g., NV memory device 120, memory array 200, or the like) and identify the memory cell(s) being written to. In additional or alternative embodiments, a detection circuit 502 may identify one or more memory cells that are adjacent to a memory cell having write operations being performed thereon (e.g., being written to) and detect/determine a write disturbance for the memory cell(s) that is/are adjacent to the memory cell being written to.

A probability circuit 504 may include any suitable hardware and/or software that is known or developed in the future that may receive and/or store probability values (p) (e.g., from a user, a computing device, computing system, computing network, and/or the like, or the like). In various embodiments, a probability circuit 504 may receive and/or store any type of probability values that may allow a predetermined degree and/or level of randomness for a random number generation circuit 506 generating random numbers corresponding to a range and/or a size of the range.

A probability value may include any suitable value that may define a mathematical chance of an event occurring. In various embodiments, the probability values may be values in the range of about [0, 1), [0, 100), [0, 1000), [0, 10000), or the like, among other probability values that are possible and contemplated herein. The probability values may be whole values, decimal values, and/or percentage values, among other rational and/or irrational values that are possible and contemplated herein. In some embodiments, the probability values include decimal values in the range of [0, 1), among other values and ranges that are possible and contemplated herein.

A range may include any suitable size that may provide a predetermined span of probability values. In various embodiments, the range may include a size of about ten values, one hundred values, one thousand values, ten thousand values, or the like, or any value there between, among other sizes that are possible and contemplated herein. In some embodiments, the range includes a size of about one hundred values, among other quantities that are possible and contemplated herein.

Probability values may be selected based on any set of parameters that may allow a memory device (e.g., NV memory device 120, memory array 200, or the like) to track/count write disturbances for sets of memory cells included therein and manage refresh operations for the sets of memory cells to control and/or maintain the health of the memory cells. In various embodiments, a probability value may be selected based on one or more counter sizes, a quantity of memory cells, quantity of sets of memory cells, a quantity of write disturbances for memory cell failure for a single memory cell, and/or a quantity of write disturbances for memory cell failure for a group/plurality of memory cells, or the like, among other parameters that are possible and contemplated herein.

A random number generation circuit 506 may include any suitable hardware and/or software that is known or developed in the future that may randomly generate numbers and/or values. In various embodiments, a random generation circuit 506 includes a random number generator that may randomly generate numbers within a predetermined range and/or defined set of numbers and/or values.

In some embodiments, a random number generation circuit 506 may randomly generate and/or select numbers and/or values within the same range and/or set of numbers/values as the probability value. For example, a random number generation circuit 506 may generate/select one hundred (100) random decimal values between [0, 1), among other sizes, ranges, numbers, and/or values that are possible and contemplated herein.

A random number generation circuit 506, in various embodiments, may be configured to randomly generate/select a number/value in response to a write disturbance for a memory cell. In additional or alternative embodiments, a random number generation circuit 506 may be configured to randomly generate a number/value in response to each write disturbance for each memory cell in a memory device. In further additional or alternative embodiments, a random number generation circuit 506 may be configured to randomly generate a number/value in response to each write disturbance for each memory cell that is adjacent to a memory cell upon which write operations are being performed.

A comparison circuit 508 may include any suitable hardware and/or software that is known or developed in the future that may compare two or more numbers/values and determine if the numbers/values are the same or different numbers/values. In various embodiments, a comparison circuit 508 may evaluate a plurality of numbers/values to determine whether a first set of numbers/values includes a particular mathematical relationship with respect to a second set of numbers/values. In some embodiments, a comparison circuit 508 may evaluate a pair of numbers/values to determine whether a number/value randomly generated by a random generation circuit 506 is greater than, less than, or equal, or the like to a probability value received by and/or stored in a probability circuit 504.

A tracking circuit 510 may include any suitable hardware and/or software that is known or developed in the future that may track the occurrence of randomly generated numbers/values. In various embodiments, a tracking circuit 510 increments counters 512 associated with memory cells in response to a comparison circuit 508 determining that randomly generated values are greater than, less than, or equal to a probability value received by and/or stored in a probability circuit 504. For example, a tracking circuit 510 may increment a counter 512 associated with a memory cell identified by the detection circuit 502 as experiencing a write disturbance each time that a comparison circuit 508 determines that a value that is randomly generated in response to the write disturbance is greater than, less than, or equal to a probability value received by and/or stored in a probability circuit 504. That is, a write disturbance for a memory cell triggers the generation of a random value that is compared to the probability value and a counter associated with the memory cell is incremented in response to the randomly generated value including a predetermined relationship with the probability value.

Any suitable quantity of counters 512 may be included in a tracking circuit 510. In various embodiments, a tracking circuit 510 may include a counter 512 for each memory cell (or physical block address (PBA)) of a memory device (e.g., NV memory device 120, memory array 200, or the like) such that the memory device includes the same quantity of counters 512 and memory cells. In some embodiments, each memory cell or PBA may include a size of about sixteen bytes (16B). As such, for a memory device (e.g., NV memory device 120, memory array 200, or the like) including a size of about one terabyte (1 TB or $2^{40}$ bytes), a tracking circuit 510 may include about $2^{36}$ counters 512 (e.g., $2^{40}$ bytes/$2^4$ bytes per counter=$2^{36}$ counters) among other memory device sizes and/or memory cell sizes that are possible and contemplated herein. That is, a tracking device 510 may include a greater quantity or a smaller quantity of counters 512 depending on the size of a memory device and/or the size of each memory cell.

A counter 512 may include any suitable hardware and/or software than may track/count the number of times a randomly generated number/value is greater than, less than, or equal to a probability value. In various embodiments, a counter 512 may be incremented in whole numbers/values to randomly count and/or track the write disturbances for a memory cell in response to the occurrence of randomly generated numbers/values being greater than, less than, and/or equal to a probability value. In some embodiments, a counter 512 is incremented in response to a comparison circuit 508 determining/evaluating that a number/value randomly generated by a random number generation circuit 506 is less than a probability value received by and/or stored in a probability circuit 504. In a specific, non-limiting example, a tracking circuit 510 may increment a counter 512 associated with a memory cell each time that a comparison circuit 508 determines that a randomly generated value between [0, 1) generated in response to a write disturbance for the memory cell is less than a probability value (e.g., 0.7) received by and/or stored in a probability circuit 504.

A counter 512 may include any suitable size that may randomly track/count the quantity of write disturbances for a memory cell in response to randomly generated numbers/values being greater than, less than, and/or equal to a probability value. In various embodiments, a counter 512 may include a size in the range of about $2^6$ bits (e.g., 0-63 counts) to about $2^{10}$ bits (e.g., 0-2048 counts), among other quantities of bits smaller than $2^6$ bits and greater than $2^{10}$ bits that are possible and contemplated herein.

Larger sized counters 512 may provide a more accurate count of write disturbances, but also consume more space in memory. Conversely, smaller sized counters 512 may provide a less accurate count of write disturbances, but consume less space in memory. As such, a balance of accuracy and storage space consumption may be predetermined, which may be implemented via selecting a corresponding probability value.

In various embodiments, a tracking circuit 510 decrements a counter 512 to a predetermined count in response to refresh operations being performed on a memory cell associated with the counter 512. In some embodiments, a tracking circuit 510 may decrement a counter 512 to a zero count or zero out a counter 512 in response to refresh operations being performed on a memory cell associated with the counter 512, among other predetermined values and/or counts that are possible and contemplated herein.

Figures 6A, 6B, 6C:
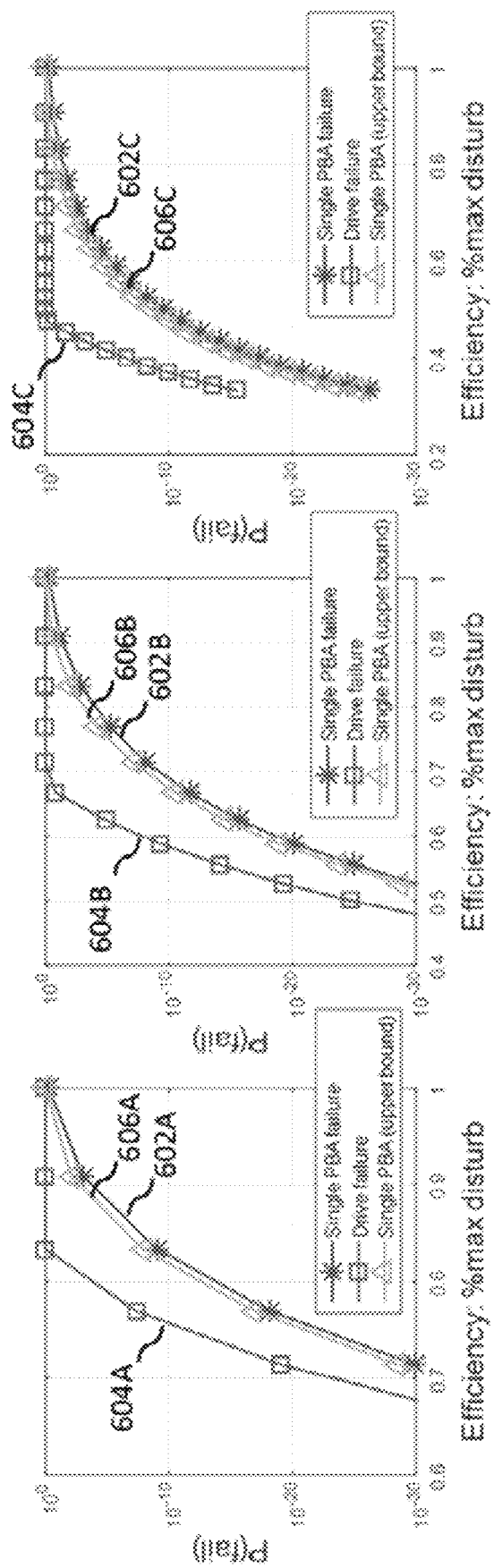
FIGS. 6A, 6B, and 6C illustrate various embodiments of a counter with different sizes included in a refresh component.

With reference to FIGS. 6A, 6B, and 6C, FIGS. 6A, 6B, and 6C illustrate various embodiments of counters 512. Specifically, FIG. 6A shows a graph 600A including a single memory cell (PBA) failure curve 602A, a memory device failure curve 604A, and an upper bound PBA curve 606A for counters 512 including a size of about 10 bits (e.g., $2^{10}$ counts). Curves 602A, 604A, and 606A plot various points with respect to the probability of failure P(fail) and efficiency (e.g., the percentage of the maximum quantity of write disturbances before failure), which is determined with respect to $10^5$ write disturbances for a memory cell and a counter size of $2^{17}$ bits to track/count the $10^5$ write disturbances. As shown in FIG. 6A, the total amount of memory space consumed by the 10-bit counters 512 in a 1 TB memory device is about 80 GB (10 bits/16 bytes×$10^{12}$≈80 GB).

FIG. 6B shows a graph 600B including a single PBA failure curve 602B, a memory device failure curve 604B, and an upper bound PBA curve 606B for counters 512 including a size of about 8 bits (e.g., $2^8$ counts). Curves 602B, 604B, and 606B plot various points with respect to the probability of failure P(fail) and efficiency (e.g., the percentage of the maximum quantity of write disturbances before failure), which is also determined with respect to $10^5$ write disturbances for a memory cell and a counter size of $2^{17}$ bits to track/count the $10^5$ write disturbances. As shown in FIG. 6B, the total amount of memory space consumed by the 8-bit counters 512 in a 1 TB memory device is about 64 GB (8 bits/16 bytes×$10^{12}$≈64 GB).

FIG. 6C shows a graph 600C including a PBA failure curve 602C, a memory device failure curve 604C, and an upper bound PBA curve 606C for counters 512 including a size of about 6 bits (e.g., $2^6$ counts). Curves 602C, 604C, and 606C plot various points with respect to the probability of failure P(fail) and efficiency (e.g., the percentage of the maximum quantity of write disturbances before failure), which is also determined with respect to $10^5$ write disturbances for a memory cell and a counter size of $2^{17}$ bits to track/count the $10^5$ write disturbances. As shown in FIG. 6C, the total amount of memory space consumed by the 6-bit counters 512 in a 1 TB memory device is about 48 GB (8 bits/16 bytes×$10^{12}$≈48 GB).

Comparing graphs 600A, 600B, and 600C illustrates that as the total amount of memory space consumed by the counters 512 decreases, the accuracy of tracking the write disturbances for each memory cell also decreases. For example, PBA failure curves 602A, 602B, and 602C for a P(fail) of $10^{10}$ shows that a 10-bit counter 512 (e.g., PBA failure curve 602A) is about 83% accurate and consumes about 80 GB of memory, an 8-bit counter 512 (e.g., PBA failure curve 602B) is about 68% accurate and consumes about 64 GB of memory, and a 6-bit counter 512 (e.g., PBA failure curve 602C) is about 50% accurate and consumes about 48 GB of memory.

With reference again to FIG. 5, a refresh circuit 514 may include any suitable hardware and/or software that may perform refresh operations on memory cells. A refresh operation may include any suitable technique, algorithm, and/or operations that may refresh a memory cell such that the memory cell is not damaged and or otherwise worn out by write operations performed on one or more memory cells that are adjacent to the memory cell. In various embodiments, refresh operations may include write-in-place operations and/or algorithms (e.g., for SCM devices), copy forward operations and/or algorithms (e.g., for NAND devices), among other refresh operations that are possible and contemplated herein.

In various embodiments, a refresh circuit 514 may perform refresh operations in response to a counter 512 being incremented to a threshold refresh count value and/or greater than the refresh count value. In some embodiments, the threshold refresh count value may be the maximum quantity of write disturbances for a memory cell (e.g., $10^5$ write disturbances or the like, among other quantities and/or devices that are possible and contemplated herein) before a memory cell may experience a malfunction and/or failure without perform a refresh operation thereon. In additional and or alternative embodiments, the threshold refresh count value may be less than the maximum quantity of write disturbances for a memory cell before a memory cell may experience a malfunction and/or failure without perform a refresh operation thereon to build in a degree a fault tolerance, which quantity may be any suitable quantity that may provide and/or allow a predetermined amount, quantity, percentage, and/or degree of fault tolerance.

The following non-limiting example may be helpful in understanding the scope and principles of a refresh component 150A. The scope and principles of a refresh component 150A are not limited to this example. Rather, the scope and principles include the scope and principles specifically discussed, as well as, any and all equivalents thereof.

In response to a detection circuit 502 detecting/determining a write disturbance for a memory cell, a random number generating circuit 506 may randomly generate a number (e.g., [0, 1), [0, 100), or the like) within a predetermined range of numbers. A comparison circuit 508 compares the randomly generated number to a probability value (e.g., 0.72) input into a probability circuit 504 to determine whether the randomly generated number is less than or equal to the probability value.

In response to the randomly generated number being less than or equal to the probability value, a tracking circuit 510 may identify the memory cell, identify a counter 512 associated with the memory cell, and increment the counter 512. In response to the randomly generated number being greater than the probability value, the tracking circuit 510 may maintain the current count in the counter 512 or not increment the counter 512 associated with the memory cell. In this manner, the counter 512 may be considered as being randomly incremented because incrementing the counter 512 is dependent on the randomly generated number including a particular relationship (e.g., greater than, less than, or equal to, or the like (less than in this example)) with respect to the probability value.

A refresh circuit 514 may determine if the counter 512 includes a threshold refresh count value. In response to the count of a counter 512 being less than the threshold refresh count value, the refresh component 150A continues detecting write disturbances and incrementing counters, or the like. In response to the count of a counter 512 being greater than or equal to the threshold refresh count value, the refresh circuit 514 performs refresh operations on the memory cell. Subsequent to the refresh operations, the tracking circuit 510 decrements the counter 512 associated with the memory cell to a predetermined value (e.g., zeroes out the counter 512).

Notably, because a memory cell may be adjacent to more than one memory cell, a write operation on a single memory cell may cause multiple adjacent memory cells to experience a write disturbance. As such, one or more counters 512 may be incremented in response to a write operation being performed on a single memory cell, provided that the randomly generated number in each instance includes the corresponding relationship to the probability value, because multiple memory cells may be experiencing a write disturbance due to the write operation.

While the above example is made with reference to a single memory cell, the various embodiments are not limited to a single memory cell. That is, a refresh component 150A may simultaneously or substantially simultaneously perform the above operations and, particularly, perform refresh operations on each of the memory cells every time that a counter 512 is incremented to a threshold refresh count value.

Figure 7:
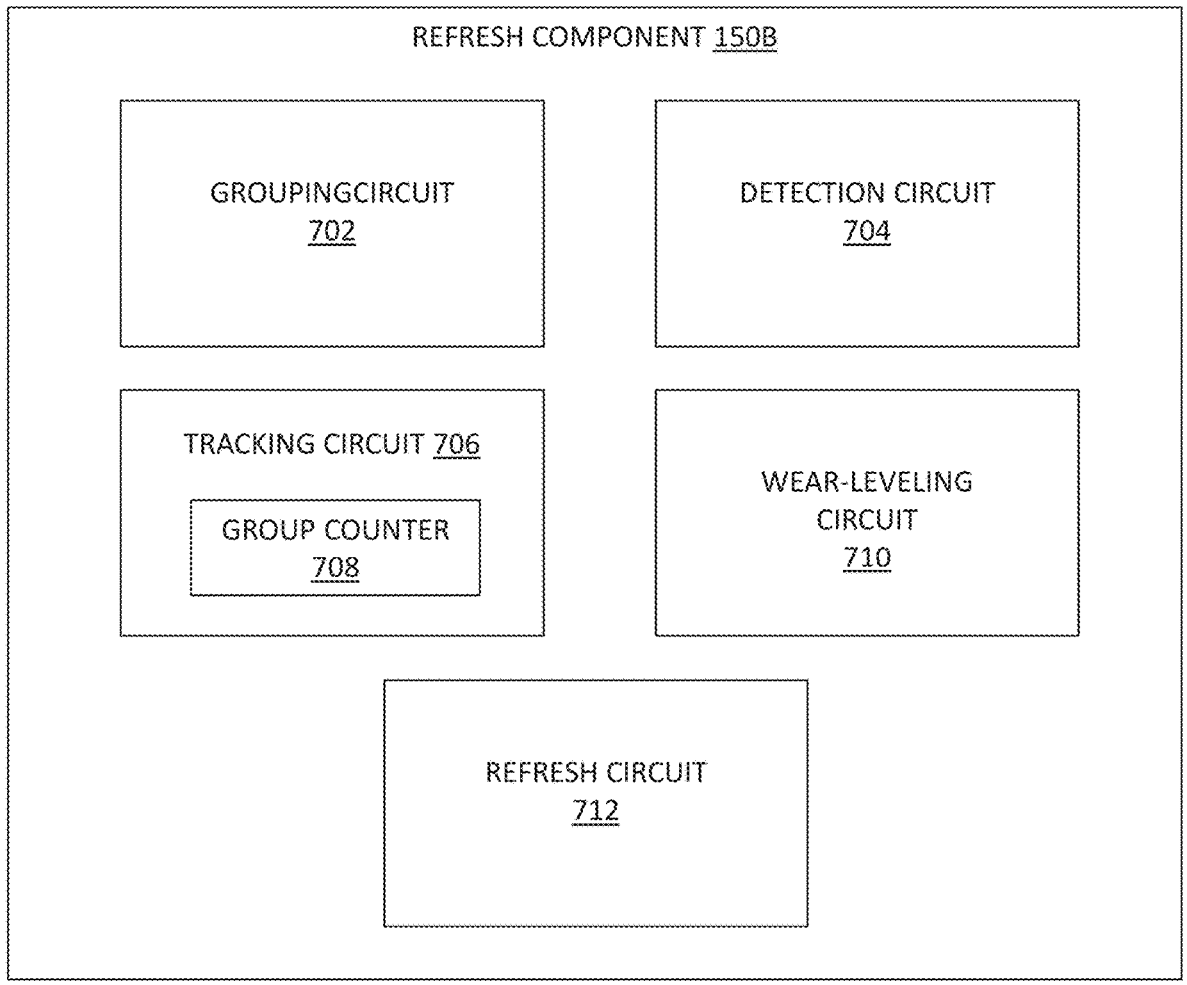
FIG. 7 is a schematic block diagram illustrating another embodiment of a refresh component included in the system of FIG. 1A and/or FIG. 1B.

Referring to FIG. 7, FIG. 7 is a block diagram of another embodiment of a refresh component 150B. At leased in the illustrated embodiment, refresh component 150B includes, among other components, a grouping circuit 702, a detection circuit 704, a tracking circuit 706 including a group counter 708, a wear-leveling circuit 710, and a refresh circuit 712.

A grouping circuit 702 may include any suitable hardware and/or software that is known or developed in the future that may combine a plurality of memory cells into a group of memory cells. A group of memory cells may include any suitable quantity of memory cells that may allow the quantity of write disturbances for the group of memory cells to be counted and or tracked. In various embodiments, a group of memory cells may include a number of memory cells in the range of about two memory cells to about thirty-two memory cells, among other ranges and/or range sizes that are possible and contemplated herein. For example, a group of memory cells may include two memory cells, four memory cells, eight memory cells, sixteen memory cells, thirty-two memory cells, or the like, among other quantities that are possible and contemplated herein.

A detection circuit 704 may include any suitable hardware and/or software that may detect and/or determine write operations and/or write disturbances. In some embodiments, a detection circuit 704 may detect/determine write operations being performed on a memory device (e.g., NV memory device 120, memory array 200, or the like) and identify the memory cell(s) being written to. In additional or alternative embodiments, a detection circuit 704 may identify one or more memory cells that are adjacent to a memory cell having write operations being performed thereon (e.g., being written to) and detect/determine a write disturbance for the memory cell(s) that is/are adjacent to the memory cell being written to.

In further additional or alternative embodiments, a detection circuit 704 may attribute write disturbances for one or more memory cells in a group of memory cells to the group of memory cells. For instance, for a group of four memory cells (e.g., a group X including memory cell A, memory cell B, memory cell C, and memory cell D), a write disturbance may be attributed to group X for each and every write disturbance for memory cell A, memory cell B, memory cell C, and memory cell D. In a non-limiting example, six write disturbances may be attributed to group X in response to two write disturbances for memory cell A, one write disturbance for memory cell B, one write disturbance for memory cell C, and two write disturbances for memory cell D, among other group and/or individual quantities of write disturbances that are possible and contemplated herein.

A tracking circuit 706 may include any suitable hardware and/or software that is known or developed in the future that may track write disturbances for a group of memory cells. In some embodiments, a tracking circuit 706 may track write disturbances for a group of memory cells based on a write disturbance for each member of the group of memory cells. For example, a tracking circuit 706 may increment a group counter 708 for tracking/counting write disturbances associated with a group of memory cells when any memory cell in the group of memory cells experiences a write disturbance.

In various embodiments, a group counter 708 may track about 200,000 counts (e.g., $2 \times 10^5$ write disturbs) for two memory cells, 400,000 counts (e.g., $4 \times 10^5$ write disturbs) for four memory cells, 800,000 counts (e.g., $8 \times 10^5$ write disturbs) for eight memory cells, 1.6 million counts (e.g., $1.6 \times 10^6$ write disturbs) for sixteen memory cells, or 3.2 million counts (e.g., $3.2 \times 10^6$ write disturbs) for thirty-two memory cells, or the like, among other quantities of counts and/or write disturbances that are possible and contemplated herein.

A group counter 708 may include any suitable size and/or number of bits that may allow the quantity of write disturbances for a group of memory cells to be tracked and/or counted. For example, a group counter 708 may include a size of about 18 bits (e.g., $2^{18}$ counts to track $2 \times 10^5$ write disturbs), 19 bits (e.g., $2^{19}$ counts to track $4 \times 10^5$ write disturbs), 20 bits (e.g., $2^{20}$ counts to track $8 \times 10^5$ write disturbs), 21 bits (e.g., $2^{21}$ counts to track $1.6 \times 10^6$ write disturbs), or 22 bits (e.g., $2^{22}$ counts to track $3.2 \times 10^6$ write disturbs), or the like, among other sizes and/or quantities of bits for tracking/counting the quantity of write disturbs for a group of memory cells that are possible and contemplated herein.

In some embodiments, each group of memory cells in a memory device (e.g., NV memory device 120, memory array 200, or the like) includes and/or is associated with a group counter 708. As such, a group counter 708 may track the quantity of write disturbs for an associated group of memory cells.

A group counter 708 may be incremented in any suitable manner that may allow the quantity of write disturbs to be counted and/or tracked. For example, a group counter 708 may be incremented in response to a write disturbance for any memory cell in a group of memory cells.

Smaller sized groups of memory cells may provide a more accurate count of write disturbances, but their associated counters 708 consume more space in memory. Conversely, larger sized groups of memory cells may provide a less accurate count of write disturbances, but their associated counters 708 consume less space in memory. As such, a balance of accuracy and storage space consumption may be predetermined, which may be implemented via selecting a corresponding group size.

In various embodiments, a tracking circuit 706 decrements a group counter 708 to a predetermined count in response to refresh operations being performed on a group of memory cells associated with the group counter 708. In some embodiments, a tracking circuit 706 may decrement a group counter 708 to a zero count or zero out a group counter 708 in response to refresh operations being performed on a group of memory cells associated with the group counter 708, among other predetermined values and/or counts that are possible and contemplated herein.

Figures 8A, 8B, 8C, 8D:
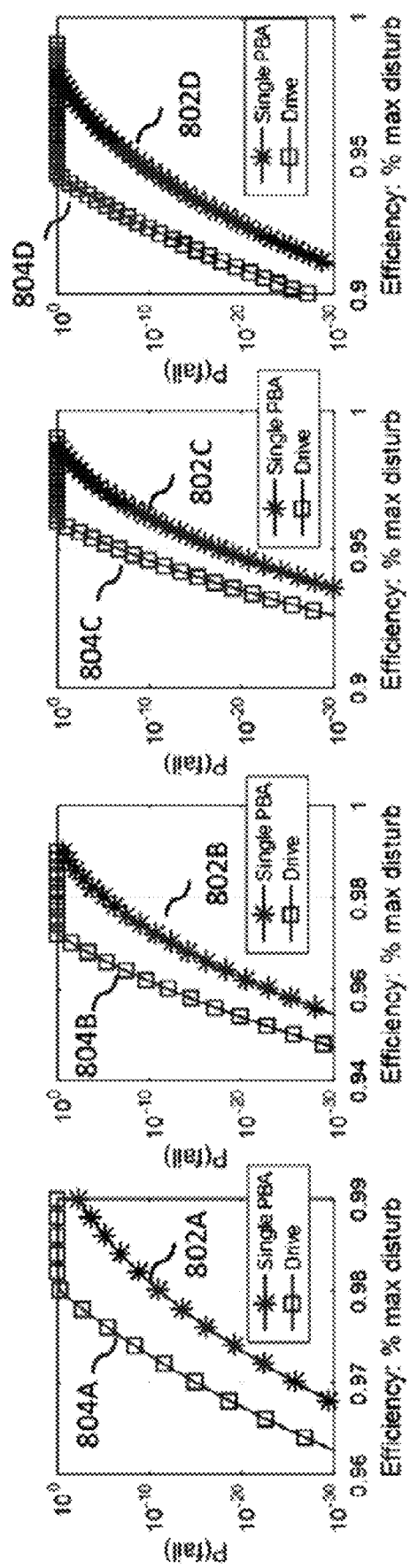
FIGS. 8A, 8B, 8C, and 8D illustrate various embodiments of a group counter with different sizes included in a refresh component.

With reference to FIGS. 8A, 8B, 8C, and 8D, FIGS. 8A, 8B, 8C, and 8D illustrate various embodiments of counters 708. Specifically, FIG. 8A shows a graph 800A including a single PBA failure curve 802A and a memory device failure curve 804A for counters 708 associated with a group of four memory cells (e.g., m=4). Curves 802A and 804A plot various points with respect to the probability of failure P(fail) and efficiency (e.g., the percentage of the maximum quantity of write disturbances before failure), which is determined with respect to $10^5$ write disturbances for each memory cell (e.g., $4 \times 10^5$ write disturbances) and a counter size of 19 bits (e.g., $2^{19}$ counts) to track/count the $4 \times 10^5$ write disturbances for the group of memory cells. As shown in FIG. 8A, the total amount of memory space consumed by the counters 708 in a 1 TB memory device is about 38 GB (19 bits/64 bytes$\times 10^{12} \approx$38 GB).

FIG. 8B shows a graph 800B including a single PBA failure curve 802B and a memory device failure curve 804B for counters 708 associated with a group of eight memory cells (e.g., m=8). Curves 802B and 804B plot various points with respect to the probability of failure P(fail) and efficiency (e.g., the percentage of the maximum quantity of write disturbances before failure), which is determined with respect to $10^5$ write disturbances for each memory cell (e.g., $8 \times 10^5$ write disturbances) and a counter size of 20 bits (e.g., $2^{20}$ counts) to track/count the $8 \times 10^5$ write disturbances for the group of memory cells. As shown in FIG. 8B, the total amount of memory space consumed by the counters 708 in a 1 TB memory device is about 20 GB (20 bits/128 bytes$\times 10^{12} \approx$20 GB).

FIG. 8C shows a graph 800C including a single PBA failure curve 802C and a memory device failure curve 804C for counters 708 associated with a group of sixteen memory cells (e.g., m=16). Curves 802C and 804C plot various points with respect to the probability of failure P(fail) and efficiency (e.g., the percentage of the maximum quantity of write disturbances before failure), which is determined with respect to $10^5$ write disturbances for each memory cell (e.g., $16 \times 10^5$ write disturbances) and a counter size of 21 bits (e.g., $2^{21}$ counts) to track/count the $16 \times 10^5$ write disturbances for the group of memory cells. As shown in FIG. 8C, the total amount of memory space consumed by the counters 708 in a 1 TB memory device is about 10.5 GB (21 bits/256 bytes$\times 10^{12} \approx$10.5 GB).

FIG. 8D shows a graph 800D including a single PBA failure curve 802D and a memory device failure curve 804D for counters 708 associated with a group of sixteen memory cells (e.g., m=32). Curves 802D and 804D plot various points with respect to the probability of failure P(fail) and efficiency (e.g., the percentage of the maximum quantity of write disturbances before failure), which is determined with respect to $10^5$ write disturbances for each memory cell (e.g., $32 \times 10^5$ write disturbances) and a counter size of 22 bits (e.g., $2^{22}$ counts) to track/count the $32 \times 10^5$ write disturbances for the group of memory cells. As shown in FIG. 8D, the total amount of memory space consumed by the counters 708 in a 1 TB memory device is about 5.5 GB (22 bits/512 bytes$\times 10^{12} \approx$5.5 GB).

Comparing graphs 800A, 800B, 800C, and 800D illustrates that as the quantity of memory cells in a group of memory cells increases, the total amount of memory space consumed by the counters 708 decreases and the accuracy of tracking the write disturbances for each memory cell also decreases. For example, PBA failure curves 802A, 802B, 802C, and 802D for a P(fail) of $10^{-20}$ shows that a group counter 708 for a group of four memory cells (e.g., PBA failure curve 802A) is about 97.5% accurate and consumes about 38 GB of memory, a group counter 708 for a group of eight memory cells (e.g., PBA failure curve 802B) is about 96% accurate and consumes about 20 GB of memory, a group counter 708 for a group of sixteen memory cells (e.g., PBA failure curve 802C) is about 95% accurate and consumes about 10.5 GB of memory, and a group counter 708 for a group of thirty-two memory cells (e.g., PBA failure curve 802D) is about 92.5% accurate and consumes about 5.5 GB of memory.

With reference again to FIG. 7, a wear-leveling circuit 710 may include any suitable hardware and/or software that is known or developed in the future that may implement a wear-leveling method, algorithm, and/or technique. In some embodiments, a wear-leveling circuit 710 evenly or substantially evenly distributes write commands and/or write operations among the memory cells of a group of memory cells. That is, a wear-leveling circuit 710 may distribute an even quantity of write commands/operations to each memory cell of a group of memory cells so that the same number of write operations are performed on each memory cell over time.

A wear-leveling circuit 710 may track the quantity of write operations performed by each memory cell of a group of memory cells using any tracking/counting mechanism, algorithm, and/or technique that is known or developed in the future. In some embodiments, a wear-leveling circuit 710 may use a group counter 708 to count write operations and/or assist in evenly or substantially evenly distributing write operations among the memory cells of a group of memory cells and/or a group of memory cells. That is, the write operations may be distributed and/or tracked at the individual memory cell level and/or at the group level.

A refresh circuit 712 may include any suitable hardware and/or software that may perform refresh operations on memory cells. A refresh operation may include any suitable technique, algorithm, and/or operations that may refresh a memory cell such that the memory cell is not damaged and or otherwise worn out by write operations performed on one or more memory cells that are adjacent to the memory cell. In various embodiments, refresh operations may include write-in-place operations and/or algorithms (e.g., for SCM devices), copy forward operations and/or algorithms (e.g., for NAND devices), among other refresh operations that are possible and contemplated herein.

In various embodiments, a refresh circuit 712 may perform refresh operations in response to a group counter 708 being incremented to a threshold refresh count value and/or greater than the refresh count value. In some embodiments, the threshold refresh count value may be the maximum quantity of write disturbances for a memory cell (e.g., $10^5$ write disturbances or the like, among other quantities and/or devices that are possible and contemplated herein) before a memory cell may experience a malfunction and/or failure without perform a refresh operation thereon. In additional or alternative embodiments, the threshold refresh count value may be less than the maximum quantity of write disturbances for a memory cell before a memory cell may experience a malfunction and/or failure without performing a refresh operation thereon to build in a degree a fault tolerance, which quantity may be any suitable quantity that may provide and/or allow a predetermined amount, quantity, percentage, and/or degree of fault tolerance. In further additional or alternative embodiments, the threshold refresh count value may be the accumulation of the maximum quantity of write disturbances for a group of memory cells or the accumulation of the maximum quantity of write disturbances for a subset of memory cells for a group of memory cells before a memory cell may experience a malfunction and/or failure without perform a refresh operation thereon (e.g., $2\times10^5$, $3\times10^5$ . . . $N\times10^5$ write disturbances). In still further additional or alternative embodiments, the threshold refresh count value may be less than the maximum quantity of write disturbances for the accumulation of the maximum quantity of write disturbances for a group of memory cells or the accumulation of the maximum quantity of write disturbances for a subset of memory cells for a group of memory cells before a memory cell may experience a malfunction and/or failure without perform a refresh operation thereon to build in a degree a fault tolerance, which quantity may be any suitable quantity that may provide and/or allow a predetermined amount, quantity, percentage, and/or degree of fault tolerance.

The following non-limiting example may be helpful in understanding the scope and principles of a refresh component 150B. The scope and principles of a refresh component 150B are not limited to this example. Rather, the scope and principles include the scope and principles specifically discussed, as well as, any and all equivalents thereof.

As write commands are received at a memory device (e.g., NV memory device 120, memory array 200, or the like), a wear-leveling circuit 710 evenly or substantially evenly distributes write operations corresponding to the write commands among the memory cells of the memory device. In response to a detection circuit 702 detecting/determining write disturbances for the memory cells, the detection circuit 702 may identify a group of memory cells with which each memory cell experiencing a write disturbance is associated and/or grouped.

In response to each write disturbance, a tracking circuit 706 may increment the group counter 708 for the group of memory cells associated with each memory cell experiencing a write disturbance. That is, a group counter 708 is incremented each time any member of the group of memory cells experiences a write disturbance.

A refresh circuit 712 may determine if the group counter 708 includes a threshold refresh count value. In response to the count of a group counter 708 being less than the threshold refresh count value, the refresh component 150B continues detecting write disturbances and incrementing counters, or the like. In response to the count of a group counter 708 being greater than or equal to the threshold refresh count value, the refresh circuit 712 performs refresh operations on each memory cell in the group of memory cells associated with the group counter 708 that is incremented to the threshold refresh count value. Subsequent to the refresh operations, the tracking circuit 706 decrements the group counter 708 associated with the group of memory cells to a predetermined value (e.g., zeroes out the group counter 708).

Notably, because a memory cell may be adjacent to more than one memory cell, a write operation on a single memory cell may cause multiple adjacent memory cells to experience a write disturbance due to the write operation. As such, one or more group counters 708 may be incremented in response to a write operation being performed on a single memory cell. In addition, or in the alternative, a group counter 708 may be incremented multiple times due to a write operation being performed on a single memory cell because multiple members of the same group of memory cells may be adjacent to the same memory cell upon which the write operation is being performed, which would result in multiple members of the group of memory cells experiencing a write disturbance due to the write operation.

While the above example is made with reference to a single group of memory cells, the various embodiments are not limited to a single group of memory cells. That is, a refresh component 150B may simultaneously or substantially simultaneously perform the above operations and, particularly, perform refresh operations on all of the memory cells in each group of memory cells every time that a group counter 708 is incremented to a threshold refresh count value.

Figure 9:
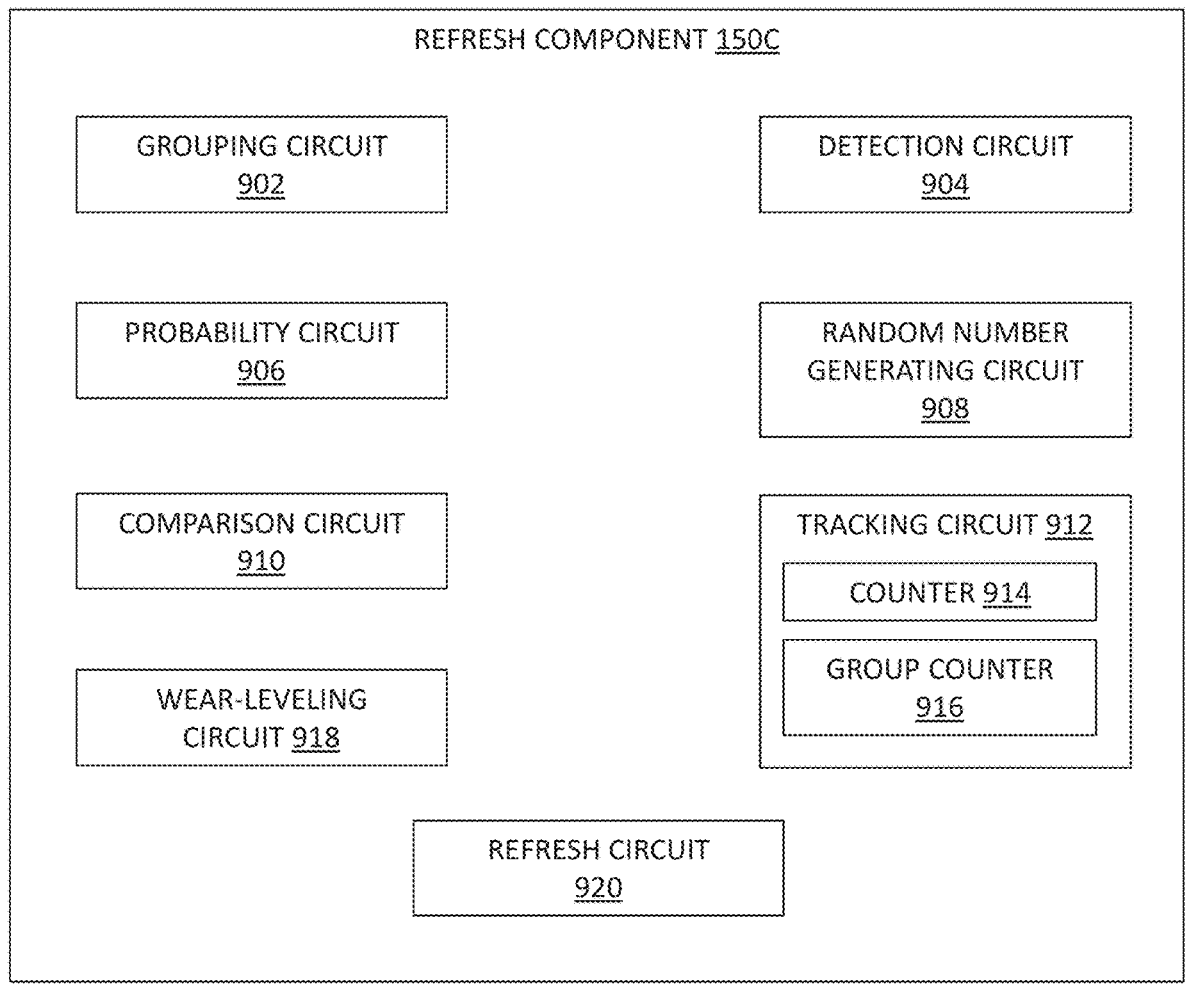
FIG. 9 is a schematic block diagram illustrating yet another embodiment of a refresh component included in the system of FIG. 1A and/or FIG. 1B.

Referring to FIG. 9, FIG. 9 is a block diagram of one embodiment of a refresh component 150C. At least in the illustrated embodiment, a refresh component 150C includes, among other components, a grouping circuit 902, a detection circuit 904, a probability circuit 906, a random number generating circuit 908, a comparison circuit 910, a tracking circuit 912 including a set of counters 914 and a set of group counters 916, a wear-leveling circuit 918, and a refresh circuit 920.

A grouping circuit 902 may include any suitable hardware and/or software that is known or developed in the future that may combine a plurality of memory cells into a group of memory cells. A group of memory cells may include any suitable quantity of memory cells that may allow the quantity of write disturbances for the group of memory cells to be counted and or tracked. In various embodiments, a group of memory cells may include a number of memory cells in the range of about two memory cells to about thirty-two memory cells, among other ranges and/or range sizes that are possible and contemplated herein. For example, a group of memory cells may include two memory cells, four memory cells, eight memory cells, sixteen memory cells, thirty-two memory cells, or the like, among other quantities that are possible and contemplated herein. In some embodiments, a grouping circuit 902 may be similar to a grouping circuit 702 discussed elsewhere herein.

A detection circuit 904 may include any suitable hardware and/or software that may detect and/or determine write operations and/or write disturbances. In some embodiments, a detection circuit 904 may detect/determine write operations being performed on a memory device (e.g., NV memory device 120, memory array 200, or the like) and identify the memory cell(s) being written to. In additional or alternative embodiments, a detection circuit 904 may identify one or more memory cells that are adjacent to a memory cell having write operations being performed thereon (e.g., being written to) and detect/determine a write disturbance for the memory cell(s) that is/are adjacent to the memory cell being written to. In some embodiments, a detection circuit 904 may be similar to a detection circuit 502 and/or a detection circuit 704, each of which is discussed elsewhere herein.

A probability circuit 906 may include any suitable hardware and/or software that is known or developed in the future that may receive and/or store probability values (p) (e.g., from a user, a computing device, computing system, computing network, and/or the like, or the like). In some embodiments, a probability circuit 906 may be similar to a probability circuit 504 discussed elsewhere herein.

In various embodiments, a random generation circuit 908 includes a random number generator that may randomly generate numbers within a predetermined range and/or defined set of numbers and/or values. In some embodiments, a random number generation circuit 908 may be similar to a random number generation circuit 506 discussed elsewhere herein.

A comparison circuit 910 may include any suitable hardware and/or software that is known or developed in the future that may compare two or more numbers/values and determine if the numbers/values are the same or different numbers/values. In various embodiments, a comparison circuit 910 may evaluate a plurality of numbers/values to determine whether a first set of numbers/values includes a particular mathematical relationship with respect to a second set of numbers/values. In some embodiments, a comparison circuit 910 may evaluate a pair of numbers/values to determine whether a number/value randomly generated by a random generation circuit 908 is greater than, less than, or equal, or the like to a probability value received by and/or stored in a probability circuit 906. In some embodiments, a comparison circuit 910 may be similar to a comparison circuit 508 discussed elsewhere herein.

A tracking circuit 912 may include any suitable hardware and/or software that is known or developed in the future that may track write disturbances for a individual memory cells and/or groups of memory cells. In some embodiments, a tracking circuit 912 may track write disturbances for individual memory cells similar to tracking circuit 510 discussed elsewhere herein. In additional or alternative embodiments, a tracking circuit 912 may track write disturbances for groups of memory cells based on a write disturbance for each member of the group of memory cells similar to a tracking circuit 706 discussed elsewhere herein.

In various embodiments, a tracking circuit 912 may include a set of counters 914 and/or a set of group counters 916. A counter 914 may include any suitable hardware and/or software than may track/count the number of times a randomly generated number/value is greater than, less than, or equal to a probability value. Further, a set of counters 914 may include any suitable quantity of counters 914. In some embodiments, a counter 914 may be similar to a counter 512 discussed elsewhere herein.

A group counter 916 may include any suitable hardware and/or software than may track/count the number of times members of a group of memory cells experience a write disturbance. Further, a set of group counters 916 may include any suitable quantity of group counters 916 and/or each group counter 916 may track any suitable quantity of memory cells forming a group of memory cells. In some embodiments, a group counter 916 may be similar to a group counter 708 discussed elsewhere herein.

A wear-leveling circuit 918 may include any suitable hardware and/or software that is known or developed in the future that may implement a wear-leveling method, algorithm, and/or technique. In some embodiments, a wear-leveling circuit 918 evenly or substantially evenly distributes write commands and/or write operations among the memory cells of a group of memory cells. That is, a wear-leveling circuit 918 may distribute an even quantity of write commands/operations to each memory cell of a group of memory cells so that the same number of write operations are performed on each memory cell over time.

A wear-leveling circuit 918 may track the quantity of write operations performed by each memory cell of a group of memory cells using any tracking/counting mechanism, algorithm, and/or technique that is known or developed in the future. In some embodiments, a wear-leveling circuit 918 may use a counter 914 and/or group counter 916 to count write operations and/or assist in evenly or substantially evenly distributing write operations among the memory cells of a group of memory cells and/or a group of memory cells. That is, the write operations may be distributed and/or tracked at the individual memory cell level and/or at the group level. In some embodiments, a wear-leveling circuit 918 may be similar to a wear-leveling circuit 710 discussed elsewhere herein.

A refresh circuit 920 may include any suitable hardware and/or software that may perform refresh operations on memory cells. A refresh operation may include any suitable technique, algorithm, and/or operations that may refresh a memory cell such that the memory cell is not damaged and or otherwise worn out by write operations performed on one or more memory cells that are adjacent to the memory cell. In various embodiments, refresh operations may include write-in-place operations and/or algorithms (e.g., for SCM devices), copy forward operations and/or algorithms (e.g., for NAND devices), among other refresh operations that are possible and contemplated herein.

In various embodiments, a refresh circuit 920 may perform refresh operations in response to a counter 914 and/or a group counter 916 being incremented to a threshold refresh count value and/or greater than the refresh count value. In some embodiments, the threshold refresh count value may be the maximum quantity of write disturbances for a memory cell (e.g., $10^5$ write disturbances or the like, among other quantities and/or devices that are possible and contemplated herein) before a memory cell may experience a malfunction and/or failure without perform a refresh operation thereon. In additional or alternative embodiments, the threshold refresh count value may be less than the maximum quantity of write disturbances for a memory cell before a memory cell may experience a malfunction and/or failure without perform a refresh operation thereon to build in a degree a fault tolerance, which quantity may be any suitable quantity that may provide and/or allow a predetermined amount, quantity, percentage, and/or degree of fault tolerance. In further additional or alternative embodiments, the threshold refresh count value may be the accumulation of the maximum quantity of write disturbances for a group of memory cells or the accumulation of the maximum quantity of write disturbances for a subset of memory cells for a group of memory cells before a memory cell may experience a malfunction and/or failure without perform a refresh operation thereon (e.g., $2\times10^5$, $3\times10^5$ . . . $N\times10^5$ write disturbances). In still further additional or alternative embodiments, the threshold refresh count value may less than the maximum quantity of write disturbances for the accumulation of the maximum quantity of write disturbances for a group of memory cells or the accumulation of the maximum quantity of write disturbances for a subset of memory cells for a group of memory cells before a memory cell may experience a malfunction and/or failure without perform a refresh operation thereon to build in a degree a fault tolerance, which quantity may be any suitable quantity that may provide and/or allow a predetermined amount, quantity, percentage, and/or degree of fault tolerance.

In some embodiments, the threshold refresh count value may be the same for the set of counters 914 and the set of group counters 916. For example, the threshold refresh count value for the set of counters 914 and the set of group counters 916 may be less than or equal to the maximum quantity of write disturbances for a memory cell (e.g., $10^5$ write disturbances or the like, among other quantities and/or devices that are possible and contemplated herein) before a memory cell may experience a malfunction and/or failure without performing a refresh operation thereon, as discussed elsewhere herein.

In other embodiments, the threshold refresh count value may be different threshold refresh count values for the set of counters 914 and the set of group counters 916. For example, the threshold refresh count value for the set of counters 914 may be less than or equal to the maximum quantity of write disturbances for a memory cell and the threshold refresh count value for the set of group counters 916 may be less than or equal to the accumulation of the maximum quantity of write disturbances for a group of memory cells or less than or equal to the accumulation of the maximum quantity of write disturbances for a subset of memory cells.

The following non-limiting example may be helpful in understanding the scope and principles of a refresh component 150C. The scope and principles of a refresh component 150C are not limited to this example. Rather, the scope and principles include the scope and principles specifically discussed, as well as, any and all equivalents thereof.

As write commands are received at a memory device (e.g., NV memory device 120, memory array 200, or the like), a wear-leveling circuit 918 may evenly or substantially evenly distribute write operations corresponding to the write commands among the memory cells of the memory device. In response to a detection circuit 904 detecting/determining write disturbances for the memory cells, the detection circuit 904 may identify a memory cell experiencing the write disturbance and a group of memory cells with which the memory cell is associated and/or grouped.

In response to a detection circuit 904 detecting/determining the write disturbance, a random number generating circuit 908 may randomly generate a number (e.g., [0, 1), [0, 100), or the like) within a predetermined range of numbers. A comparison circuit 910 compares the randomly generated number to a probability value (e.g., 0.83) input into a probability circuit 906 to determine whether the randomly generated number is less than or equal to the probability value.

In response to the randomly generated number being greater than the probability value, the tracking circuit 912 may maintain the current count in the counter 914 (e.g., not increment the counter 914) associated with the memory cell. In further response to each write disturbance, the tracking circuit 912 may increment a group counter 916 for the group of memory cells associated with the memory cell experiencing the write disturbance.

A refresh circuit 920 may determine if the counter 914 and/or group counter 916 include a respective threshold refresh count value, which may be the same or different refresh count values. In response to the counter 914 and the group counter 916 being less than their respective threshold refresh count values, the refresh component 150C continues detecting write disturbances, incrementing counters 914 responsive to value/probability value comparisons, and incrementing group counters 916, or the like.

In response to a counter 914 being greater than or equal to its threshold refresh count value, the refresh circuit 920 performs refresh operations on the memory cell associated with the counter 914. Subsequent to refresh operations, the tracking circuit 912 decrements the counter 914 to a predetermined value (e.g., zeroes out the counter 914).

Further, in response to the group counter 916 being greater than or equal to its threshold refresh count value, the refresh circuit 920 performs refresh operations on each memory cell in the group of memory cells associated with the group counter 916. Subsequent to refresh operations, the tracking circuit 912 decrements the group counter 916 to a predetermined value (e.g., zeroes out the group counter 916), which may be a different or the same decremented predetermined value as counters 914.

Notably, because a memory cell may be adjacent to more than one memory cell, a write operation on a single memory cell may cause multiple adjacent memory cells to experience a write disturbance due to the write operation. As such, one or more counters 914 may be incremented in response to a write operation being performed on a single memory cell, provided that the randomly generated number in each instance includes the corresponding relationship to the probability value. Further, one or more group counters 916 may be incremented in response to a write operation being performed on a single memory cell. In addition, or in the alternative, a group counter 916 may be incremented multiple times due to a write operation being performed on a single memory cell because multiple members of the same group of memory cells may be adjacent to the same memory cell upon which the write operation is being performed, which would result in multiple members of the group of memory cells experiencing a write disturbance due to the write operation.

While the above example is made with reference to a single memory cell and/or single group of memory cells, the various embodiments are not limited to such. That is, a refresh component 150C may simultaneously or substantially simultaneously perform the above operations and, particularly, perform refresh operations on each memory cell of a memory device every time that a counter 914 is incremented to its corresponding threshold refresh count value and/or perform refresh operations on each memory cell of a group of memory cells every time that a group counter 916 is incremented to its corresponding threshold refresh count value.

Figure 10:
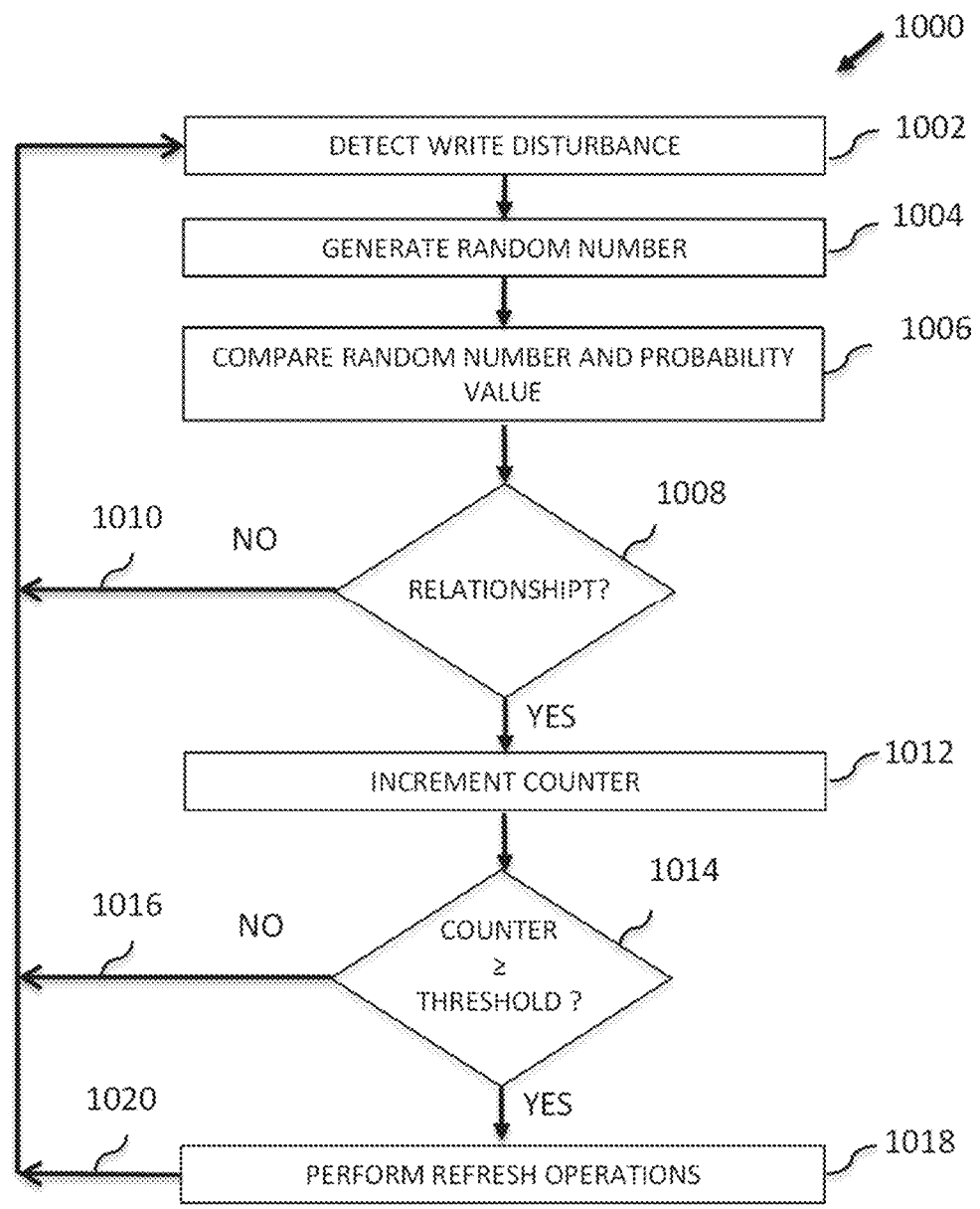
FIG. 10 is a schematic flow diagram of one embodiment of a method for managing refresh operations in a memory device.

With reference to FIG. 10, FIG. 10 is a schematic flow diagram of one embodiment of a method 1000 for managing refresh operations in a memory device (e.g., NV memory device 120, memory array 200, or the like). At least in the illustrated embodiment, the method 1000 begins by a detection circuit (e.g., detection circuit 502 or 904) detecting a write disturbance for a memory cell (block 1002).

In response to detecting the write disturbance, a random number generating circuit generates a random number (block 1004). A random number may be generated in any suitable manner, as discussed elsewhere herein.

A comparison circuit compares the randomly generated number to a probability value stored in a probability circuit (block 1006) to determine whether the randomly generated number includes a predetermined relationship with respect to the probability value (block 1008), which may be a mathematical relationship including the randomly generated number being greater than, less than, or equal to, or the like the probability value. The randomly generated number may be compared to the probability value to determine the relationship in any suitable manner, as discussed elsewhere herein.

In response to the randomly generated number not including the predetermined relationship (e.g., a "NO" in block 1008), the method 1000 returns to block 1002 to continue detecting write disturbances (return 1010). In response to the randomly generated number including the predetermined relationship (e.g., a "YES" in block 1008), the method 1000 includes a tracking circuit incrementing a counter (block 1012).

A refresh circuit may determine whether a count in a counter is greater than or equal to a threshold refresh count value (block 1014). A threshold refresh account value may be any suitable value that may allow a memory cell to be refreshed before a maximum quantity of write disturbances is experienced by the memory cell before refresh operations are used to protect the memory cell, as discussed elsewhere herein.

In response to the counter including less than the threshold refresh count value (e.g., a "NO" in block 1014), the method 1000 returns to block 1002 to continue detecting write disturbances (return 1016). In response to the counter including greater than or equal to the threshold refresh count value (e.g., a "YES" in block 1014), the refresh circuit may perform refresh operations on the memory cell (block 1018). Subsequent to performing the refresh operations, the method 1000 returns to block 1002 to continue detecting write disturbances (return 1020).

Figure 11:
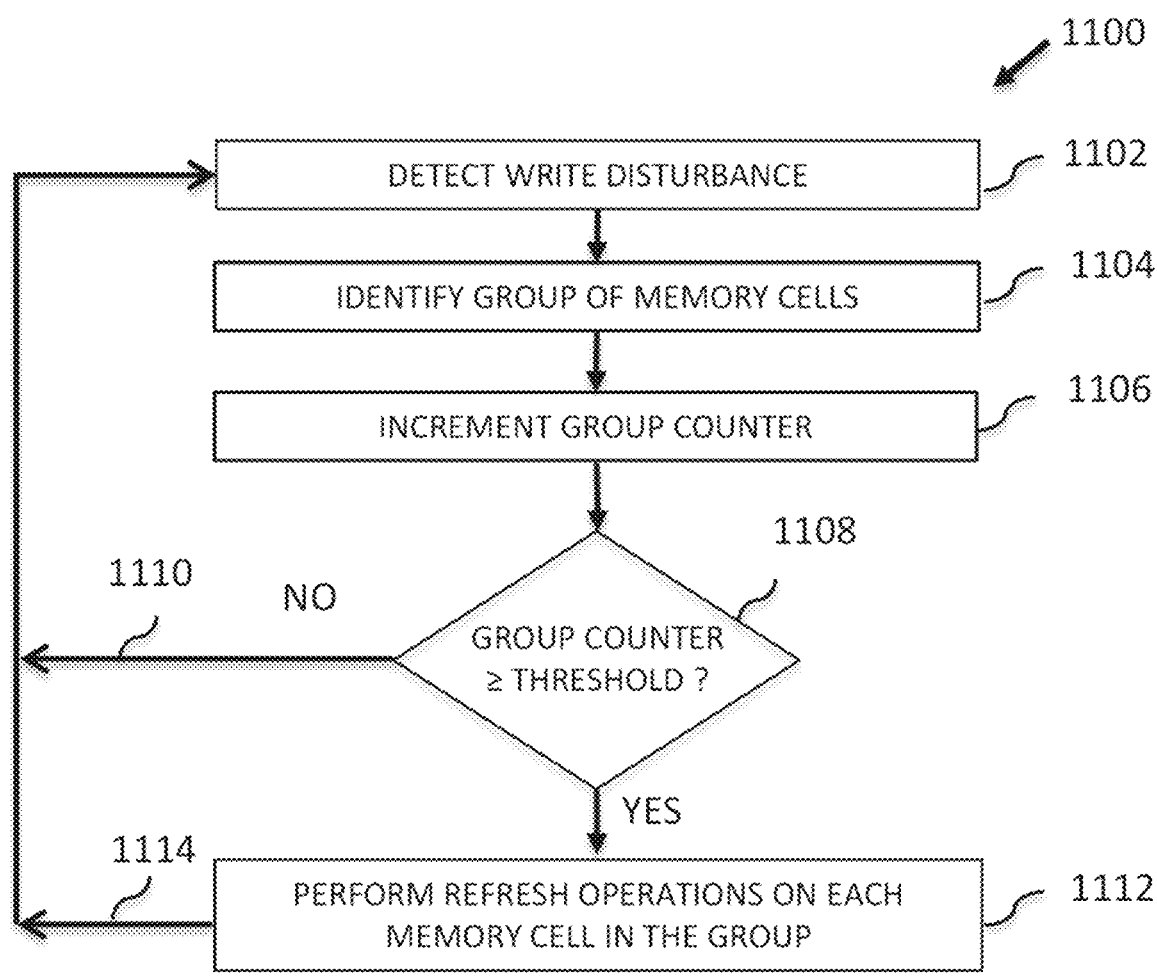
FIG. 11 is a schematic flow diagram of another embodiment of a method for managing refresh operations in a memory device.

Referring to FIG. 11, FIG. 11 is a schematic flow diagram of another embodiment of a method 1100 for managing refresh operations in a memory device (e.g., NV memory device 120, memory array 200, or the like). At least in the illustrated embodiment, the method 1100 begins by a detection circuit (e.g., detection circuit 702 or 904) detecting a write disturbance for a memory cell (block 1102).

The detection circuit may identify a group of memory devices associated with the memory device experiencing the write disturbance (block 1104). A tracking circuit may increment a group counter associated with the group that includes the memory cell experiencing the write disturbance (block 1106).

A refresh circuit may determine whether a count in the group counter is greater than or equal to a threshold refresh count value (block 1108). A threshold refresh account value for a group of memory cells may be any suitable value that may allow a memory cell and/or group of memory cells to be refreshed before a maximum quantity of write disturbances is experienced by the memory cell(s) and/or group of memory cells before refresh operations are used to protect the memory cells, as discussed elsewhere herein.

In response to the group counter including less than the threshold refresh count value (e.g., a "NO" in block 1108), the method 1100 returns to block 1102 to continue detecting write disturbances (return 1110). In response to the group counter including greater than or equal to the threshold refresh count value (e.g., a "YES" in block 1108), the refresh circuit may perform refresh operations on the memory cell (block 1112). Subsequent to performing the refresh operations, the method 1100 returns to block 1102 to continue detecting write disturbances (return 1114).

Figure 12:
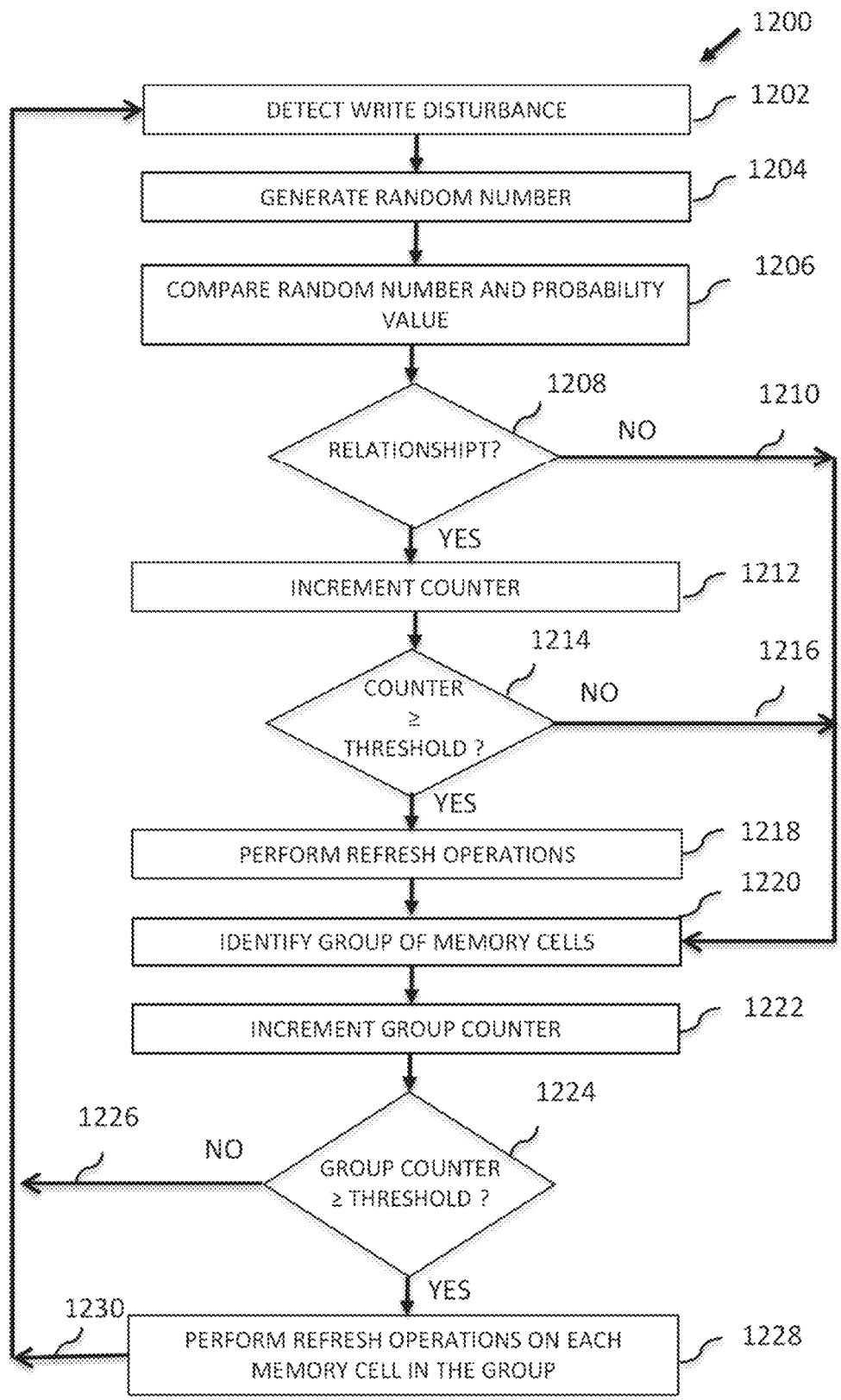
FIG. 12 is a schematic flow diagram of yet another embodiment of a method for managing refresh operations in a memory device.

With reference to FIG. 12, FIG. 12 is a schematic flow diagram of yet another embodiment of a method 1200 for managing refresh operations in a memory device (e.g., NV memory device 120, memory array 200, or the like). At least in the illustrated embodiment, the method 1200 begins by a detection circuit (e.g., detection circuit 502, 704, or 904) detecting a write disturbance for a memory cell (block 1202).

In response to detecting the write disturbance, a random number generating circuit generates a random number (block 1204). A random number may be generated in any suitable manner, as discussed elsewhere herein.

A comparison circuit compares the randomly generated number to a probability value stored in a probability circuit (block 1206) to determine whether the randomly generated number includes a predetermined relationship with respect to the probability value (block 1208), which may be a mathematical relationship including the randomly generated number being greater than, less than, or equal to, or the like to the probability value. The randomly generated number may be compared to the probability value to determine the relationship in any suitable manner, as discussed elsewhere herein.

In response to the randomly generated number not including the predetermined relationship (e.g., a "NO" in block 1208), the method 1200 advances to block 1220 (advance 1210). In response to the randomly generated number including the predetermined relationship (e.g., a "YES" in block 1208), the method 1200 includes a tracking circuit incrementing a counter (block 1212).

A refresh circuit may determine whether a count in a counter is greater than or equal to a threshold refresh count value (block 1214). A threshold refresh account value may be any suitable value that may allow a memory cell to be refreshed before a maximum quantity of write disturbances is experienced by the memory cell before refresh operations are used to protect the memory cell, as discussed elsewhere herein.

In response to the counter including less than the threshold refresh count value (e.g., a "NO" in block 1214), the method 1200 advances to block 1220 (advance 1216). In response to the counter including greater than or equal to the threshold refresh count value (e.g., a "YES" in block 1214), the refresh circuit may perform refresh operations on the memory cell (block 1218).

Subsequent to performing the refresh operations, the detection circuit may identify a group of memory devices associated with the memory device experiencing the write disturbance (block 1220). The tracking circuit may increment a group counter associated with the group that includes the memory cell experiencing the write disturbance (block 1222).

A refresh circuit may determine whether a count in the group counter is greater than or equal to a threshold refresh count value (block 1224). A threshold refresh account value for a group of memory cells may be any suitable value that may allow a memory cell and/or group of memory cells to be refreshed before a maximum quantity of write disturbances is experienced by the memory cell(s) and/or group of memory cells before refresh operations are used to protect the memory cells, as discussed elsewhere herein.

In response to the group counter including less than the threshold refresh count value (e.g., a "NO" in block 1224), the method 1200 returns to block 1202 to continue detecting write disturbances (return 1226). In response to the group counter including greater than or equal to the threshold refresh count value (e.g., a "YES" in block 1224), the refresh circuit may perform refresh operations on the memory cell (block 1228). Subsequent to performing the refresh operations, the method 1200 returns to block 1202 to continue detecting write disturbances (return 1230).

A means for maintaining and/or operating a refresh component (e.g., refresh component 150, 105A, 150B, and 150C), in various embodiments, may include one or more of a non-volatile memory device 120, a controller 126, a non-volatile memory device interface 139, a host computing device 110, a device driver, a controller (e.g., a device driver, or the like) executing on a host computing device 110, a device controller 126, 244, an on-die controller 220, a state machine 222, a processor 111, an FPGA, an ASIC, other logic hardware, and/or other executable code stored on a computer-readable storage medium. Other embodiments may include similar or equivalent means for maintaining and/or operating a refresh component (e.g., refresh component 150, 105A, 150B, and 150C).

Other means for maintaining and/or operating a refresh component (e.g., refresh component 150, 105A, 150B, and 150C), in various embodiments, may include an on-die controller 220, read/write circuit(s) 230A/230B, a controller 244 executing on a non-volatile storage device 210, other logic hardware, and/or other executable code stored on a computer-readable storage medium. Other embodiments may include similar or equivalent means for maintaining and/or operating a refresh component (e.g., refresh component 150, 105A, 150B, and 150C).

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
a controller for a memory device including a plurality of memory cells, the controller configured to:
in response to a write disturbance for a memory cell of the plurality of memory cells, randomly increment a first counter of a set of counters associated with the set of memory cells, the first counter associated with the memory cell, and
in response to the first counter being randomly incremented to a first predetermined count, perform a refresh operation on the memory cell.

2. The apparatus of claim 1, wherein the controller, when randomly incrementing the first counter, is further configured to:
randomly generate a value in response to each write disturbance;
increment the first counter in response to the value being less than or equal to a probability value; and
maintain a current count in the first counter in response to the value being greater than the probability value.

3. The apparatus of claim 2, wherein the value and the probability value are each values in the range of [0, 1).

4. The apparatus of claim 1, wherein the first predetermined count is based on a size of the first counter.

5. The apparatus of claim 1, wherein:
the plurality of memory cells are divided into sets of a plurality of memory cells; and
the controller is further configured to:
increment a second counter associated with a set of memory cells in response to a write disturbance for any memory cell in the set of memory cells, and
in response to the second counter being incremented to a second predetermined count, perform the refresh operation on each memory cell in the set of memory cells.

6. The apparatus of claim 5, wherein the second predetermined count is based on a first size (b) of the second counter.

7. The apparatus of claim 6, wherein:
the first size (b) of the second counter is less than or equal to a quantity (n) of write disturbances for a memory cell failure multiplied by a quantity (m) of memory cells in the set of memory cells (b≤n*m); and
the second predetermined count (c) is less than or equal to the first size (b) of the second counter (c≤b).

8. The apparatus of claim 6, wherein the first predetermined count is based on a second size of the first counter.

9. The apparatus of claim 1, wherein:
the memory device comprises one or more of a resistive random access memory (ReRAM) device, a magnetoresistive random access memory (MRAM) device, and a phase change memory (PCM) device; and
the refresh operation comprises one of a write-in-place operation and a copy forward operation.

10. A system comprising:
a storage class memory device including a plurality of sets of memory cells, each set of memory cells associated with a counter; and
a controller for the storage class memory device, the controller configured to:
increment a counter associated with a set of memory cells in response to a write disturbance for any memory cell in the set of memory cells, and
in response to the counter being incremented to a predetermined count, perform a refresh operation on each memory cell in the set of memory cells.

11. The system of claim 10, wherein:
the first size (b) of the second counter is less than or equal to a quantity (n) of write disturbances for a memory cell failure multiplied by a quantity (m) of memory cells in the set of memory cells (b≤n*m); and
the second predetermined count (c) is less than or equal to the first size (b) of the second counter (c≤b).

12. The system of claim 10, wherein the controller is further configured to:
perform wear-leveling operations to evenly distribute write operations among memory cells of each set of memory cells; and
utilize the counter in performing the wear-leveling operations.

13. The system of claim 10, wherein:
the storage class memory device comprises one or more of a resistive random access memory (ReRAM) device, a magnetoresistive random access memory (MRAM) device, and a phase change memory (PCM) device; and
the refresh operation comprises one of a write-in-place operation and a copy forward operation.

14. An apparatus comprising:
means for randomly incrementing a first counter associated with a set of memory cells of a plurality of sets of memory cells of a write-in-place memory device in response to a write disturbance for the associated set of memory cells; and
means for performing a refresh operation on each memory cell in the set of memory cells in response to the first counter being randomly incremented to a first predetermined count.

15. The apparatus of claim 14, wherein each set of memory cells comprises a single memory cell, the apparatus further comprising:
means for randomly generating a value in response to each write disturbance;
means for incrementing the first counter in response to the value being less than or equal to a probability value; and
means for maintaining a current count in the first counter in response to the value being greater than the probability value.

16. The apparatus of claim 14, wherein the first predetermined count is based on a size of the first counter.

17. The apparatus of claim 14, wherein:
each set of memory cells comprises a plurality of memory cells; and
the means for randomly incrementing the first counter comprises means for incrementing the first counter in response to a write disturbance for any memory cell in the set of memory cells.

18. The apparatus of claim 17, further comprising:
a plurality of second counters associated with respective each memory cell of the plurality of memory cells;
means for randomly generating a value in response to the write disturbance;
means for incrementing a second counter associated with a memory cell for the write disturbance in response to the value being less than or equal to a probability value;
means for maintaining a current count in the second counter in response to the value being greater than the probability value; and
means for performing the refresh operation on the memory cell in response to the second counter being incremented to a second predetermined count.

19. The apparatus of claim 18, wherein:
the first predetermined count is based on a first size of the first counter; and
the second predetermined count is based on a second size of the second counter.

20. The apparatus of claim 14, wherein the write-in-place memory device comprises one or more of a resistive random access memory (ReRAM) device, a magnetoresistive random access memory (MRAM) device, and a phase change memory (PCM) device.

* * * * *